(12) United States Patent
Okuda

(10) Patent No.: US 7,535,744 B2
(45) Date of Patent: May 19, 2009

(54) SEMICONDUCTOR INTEGRATED CIRCUIT AND IC CARD SYSTEM HAVING INTERNAL INFORMATION PROTECTION

(75) Inventor: Yuichi Okuda, Higashimurayama (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/867,917

(22) Filed: Oct. 5, 2007

(65) Prior Publication Data

US 2008/0031031 A1 Feb. 7, 2008

Related U.S. Application Data

(62) Division of application No. 11/378,276, filed on Mar. 20, 2006, now Pat. No. 7,295,455, which is a division of application No. 10/725,477, filed on Dec. 3, 2003, now Pat. No. 7,042,752.

(30) Foreign Application Priority Data

Dec. 13, 2002 (JP) ............................. 2002-362672
Sep. 17, 2003 (JP) ............................. 2003-323923

(51) Int. Cl.
*G11C 13/04* (2006.01)
(52) U.S. Cl. .................. 365/112; 365/64; 345/207; 326/8; 250/214 SW
(58) Field of Classification Search ................ 365/112, 365/64; 345/207; 326/8; 250/214 R, 214 SW
See application file for complete search history.

(56) References Cited

U.S. PATENT DOCUMENTS 5,157,335 A * 10/1992 Houston ..................... 324/537
5,477,151 A 12/1995 Houston
6,072,328 A 6/2000 Takuma
6,458,547 B1 10/2002 Bryan et al.
6,518,962 B2 2/2003 Kimura et al.
6,649,356 B2 11/2003 Bryan et al.
6,649,357 B2 11/2003 Bryan et al.
6,682,899 B2 1/2004 Bryan et al.

FOREIGN PATENT DOCUMENTS

| JP | 10-320293 A | 12/1998 |
| JP | 11-102324 A | 4/1999 |
| JP | 2000-216345 A | 8/2000 |

* cited by examiner

*Primary Examiner*—VanThu Nguyen
(74) *Attorney, Agent, or Firm*—Miles & Stockbridge P.C.

(57) ABSTRACT

A semiconductor integrated circuit capable of protection from card hacking, by which erroneous actions are actively induced by irradiation with light and protected secret information is illegitimately acquired, is to be provided. Photodetectors, configured by a standard logic process, hardly distinguishable from other circuits and consumes very little standby power, are mounted on a semiconductor integrated circuit, such as an IC card microcomputer. Each of the photodetectors, for instance, has a configuration in which a first state is held in a static latch by its initializing action and reversal to a second state takes place when semiconductor elements in a state of non-conduction, constituting the static latch of the first state, is irradiated with light. A plurality of photodetectors are arranged in a memory cell array. By incorporating the static latch type photodetector into the memory array, they can be arranged inconspicuously. Reverse engineering by irradiation with light can be effectively prevented.

11 Claims, 18 Drawing Sheets

SEMICONDUCTOR INTEGRATED CIRCUIT AND IC CARD SYSTEM HAVING INTERNAL INFORMATION PROTECTION

CROSS-REFERENCE TO RELATED APPLICATION

This application is a division of application Ser. No. 11/378,276 filed Mar. 20, 2006, now U.S. Pat. No. 7,295,455 which is a division of application Ser. No. 10/725,477 filed Dec. 3, 2003 (now U.S. Pat. No. 7,042,752).

BACKGROUND OF THE INVENTION

The present invention relates to a semiconductor integrated circuit and an IC card, and more particularly to a technique that can be effectively applied to, for instance, the prevention of reverse engineering of a cryptographic key or the like held by a semiconductor integrated circuit, such as a microcomputer for IC cards.

Along with the development of semiconductor technology, it has become a common practice to settle accounts in a safe and secure way by incorporating integrated circuits (ICs) into credit cards, securities or the like and communicating account information in an encrypted form. This IC-based method makes it more difficult to forge a paper or use another person's name than the conventional method of using magnetic records, and as such is beneficial to both end users and service providers.

Cryptographic algorithms have been studied for many years, making it extremely difficult to infer a cryptographic key from signals obtained by tapping a communication line, and this risk is virtually negligible. A real problem, however, is posed by attempts to open an IC and reverse-engineering it to directly read internal information or a cryptographic key contained in the IC. Reverse engineering is a technique or an act to analyze the structure and/or specifications of a hardware or software product and thereby and thereby reveal the technical information contained.

Previously devised reverse engineering techniques was to read internal information or a cryptographic key contained in an IC card by supplying a clock of an illegitimate frequency to the card, abruptly raising or reducing the voltage of power supply to it or irradiating it with a powerful electromagnetic wave to abnormally operate the IC card. On the part of the IC card, such intrusions were fought back by detecting such abnormal states, and preventing internal information or the cryptographic key from being read out on the basis of the detected acts.

For instance, according to a technique described in Patent Reference 1, an IC chip for an IC card is provided with an unsealing sensor and, if it detects unsealing, a CPU will erase data in the memory to ensure safe protection of secrets.

Patent Reference 2 describes a technique according to which a small hole is bored in a part of a package to seal and shadow the circuit configuration so that only the sensor part for light detection be illuminated with a light and the circuit can operate normally only when the light is detected. Since an unauthorized analyst would open the package in a dark place to avoid adverse impacts of light, the circuit would operate differently from its usual way in a state in which no light is detected. This different operation makes impossible analysis of the normal operation of the circuit and accordingly illegitimate reading of the stored information.

Patent Reference 3 discloses a technique according to which a plurality of light receiving elements are integrated on an IC in a distributive way, and each of the plurality of light receiving elements is connected to one of a connection line connected to a nonvolatile memory cell, a connection line connected to a logic circuit and a connection line connected to a logic element and, by intercepting, establishing conduction of or grounding these connection lines, the circuits related to the respective connection lines are inhibited from normally operating so that the internal information contained in the IC can be protected even if it is unsealed.

Patent Reference 1: Japanese Published Unexamined Patent Application No. Hei 10(1998)-320293

Patent Reference 2: Japanese Published Unexamined Patent Application No. 2000-216345 (paragraphs 0009 through 0011)

Patent Reference 3: Japanese Published Unexamined Patent Application No. Hei 11(1999)-102324

SUMMARY OF THE INVENTION

However, the techniques disclosed in these references give no regard to the new card hacking contrivance of actively inducing erroneous actions by irradiation with light and analyzing the result by a statistical technique. The inventor studied how it can be prevented. In recent years, a new technique of reverse-engineering an IC card has been proposed by which the IC is unsealed and erroneous actions are induced by irradiation with powerful light. To counter it, a sensor that can detect the irradiation of an IC card with light has to be developed.

Semiconductor active elements are usually integrated on an IC include diodes, bipolar transistors and metal oxide semiconductor field effect transistors (MOSFETs). The voltage and current characteristics of every type of them heavily depend of the characteristics of the pn junction, which is the boundary between a p-type semiconductor and an n-type semiconductor.

In a p-type semiconductor, positive holes where positive charges are dominant among moving charges are dominant, while in an n-type semiconductor free electrons having negative charges are dominant. The positive holes and free electrons are collectively called carriers. In a pn junction, there emerges a region which is known as a depletion layer where the probability of the existence of carriers is extremely low because positive holes and free electrons are recombined there.

When the potential of the p-type semiconductor is high and that of the n-type semiconductor is low in a pn junction (a state known as forward bias), positive holes in the p-type semiconductor are accelerated by the electric field and flow into the depletion layer. Similarly, free electrons in the n-type semiconductor are also accelerated by the electric field and flow into the depletion layer. In the depletion layer, positive holes and free electrons are recombined. As this phenomenon occurs continually, a current flows in a forward biased state.

Conversely, when the potential of the p-type semiconductor is low and that of the n-type semiconductor is high (a state known as reverse bias), positive holes in the p-type semiconductor and free electrons in the n-type semiconductor do not flow into the depletion layer because the direction of the electric field is against them. Further, as carriers hardly exist in the depletion layer, no carriers flow out of the depletion layer. As a result, a current scarcely flows in a reversely biased state.

Generally, a semiconductor logic circuit uses a bipolar transistor or a MOSFET as a switch, and a high resistance in a reversely biased state is in a state of non-conduction (OFF). Supposing here a case in which light comes incident on a depletion layer in a reversely biased state. When high energy (short wavelength) photons collide against valence electrons in the semiconductor, the valence electrons are excited to become free electrons, and regions having lost electrons and acquired positive charges become positive holes. Thus the incidence of light gives rise to paired positive holes and free electrons. The generated positive holes are accelerated by the electric field, flow out to the p-type semiconductor, while the free electrons flow out to the n-type semiconductor. As long as light continues to come incident, the generation of positive holes and free electrons continues, and therefore a current flows in a reverse bias to the pn junction when light comes incident.

If the electric field working on the depletion layer is sufficiently large and the paired positive holes and free electrons that have been generated are scarcely recombined and flow out of the depletion layer, the amplitude of the current will be proportional to the number of photons having come incident. Thus by bringing to incidence sufficiently powerful light, it will be made possible to let flow a larger current to the switching element of a semiconductor in an OFF state than to the switching element of a semiconductor in an ON state, and the circuit can be induced to commit erroneous actions. By actively inducing erroneous actions in this way, the erroneous actions may let out information which should not be supplied, and a statistical analysis of such information may make possible card hacking.

An object of the present invention is to provide a semiconductor integrated circuit, and further an IC card, that can be protected against the way of card hacking by which erroneous actions are actively induced by irradiation with light and thereby protected secret information is illegitimately acquired.

The above-described and other objects and novel features of the invention will become more apparent from the following description in this specification when taken in conjunction with the accompanying drawings.

Typical aspects of the invention disclosed in this application will be briefly described below.

[1] Usually an IC is designed not to let internal information or a cryptographic key be directly supplied outside if it is operating normally. However, it is difficult to fully protect internal information or a cryptographic key in a state in which the circuit is operating erroneously. An effective technique therefore would be to prevent internal information or a cryptographic key from being supplied externally by stopping the operation of the circuit if irradiation with light is detected (for instance by initializing the internal state with a reset instruction and keeping that reset instruction in effect continuously).

This would require a photodetector. As a semiconductor element for detecting light, usually a photodiode for use in a semiconductor image pickup element or the like is thought of. However, since no photodiode is made available in a usual logic process, using a photodiode would mean an extra cost. Moreover, the use of a peculiar element such as a photodiode would make the location of the photodetector readily identifiable. Once it is known, the photodetector can be masked by metal deposition with a field ion beam (FIB) or otherwise, and therefore this is not a secure enough defense.

Further, in anticipation of the convenience after the IC card is mounted on a mobile device or the like, the smaller the power consumption of the IC card itself, the more desirable it is. Since a photodetector has no purpose to serve during the normal operation of the circuit, its standby power consumption should preferably be close to zero.

In view of this point, it is intended to effectively prevent a semiconductor integrated circuit, such as an IC card microcomputer, from being reverse-engineered by irradiation with light by mounting a photodetector which (1) is configured of a standard logic process, (2) is difficult to be distinguished from other circuits and (3) consumes very little power when standing by. The following means are used to achieve this purpose.

[2] (Static latch type) A semiconductor integrated circuit according to the present invention holds a static latch in a first state in its initial state, and has in a memory cell array a photodetector which, when a photo-detecting semiconductor element in a state of non-conduction constituting the static latch in the first state is irradiated with light, is reversed into a second state, wherein photo-detection by the photodetector is used for stopping internal actions. By assembling the static latch type photodetector into the memory array, the photodetector can be arranged inconspicuously.

In a specific mode of implementing the invention, the photo-detecting semiconductor element in a state of non-conduction is a MOS transistor constituting a static latch. In another mode, a diode element is provided as the photo-detecting semiconductor element, wherein the diode element is connected in a reverse bias in parallel with the MOS transistor.

In the optimum mode, wherein the memory cell array has a SRAM module in which static type memory cells are arranged in a matrix, and a plurality of the photodetectors are distributively arranged in the memory cell array of the SRAM module in place of some of the static type memory cells.

Although there are no memory cells where there are photodetectors, it is possible to use a redundant configuration which can compensate for the lack of static type memory cells. Alternatively, an ECC circuit may be used that can detect and correct data errors resulting from the absence of static type memory cells replaced by the photodetectors.

(Push-pull type) A semiconductor integrated circuit according to a second aspect of the invention is provided with a plurality of photodetectors each having a semiconductor element and a photo-detecting semiconductor element arranged in series on a current path and respectively placed in a state of conduction and in a state of non-conduction when they are operable, wherein the potential of the connection point between the semiconductor element in the state of conduction and the photo-detecting semiconductor element in the state of non-conduction varies according to the ratio between a current driving force which varies when the photo-detecting semiconductor element in the state of non-conduction is irradiated with light and the current driving force of the semiconductor element in the state of conduction, and photo-detection by the photodetectors is used for stopping internal actions. A plurality of photodetectors should preferably arranged distributively when applied to a logic circuit module operated in synchronism with a clock signal. Photodetectors of a push-pull type are inconspicuous relative to the logic circuit, and accordingly the positions of their presence are not easily perceivable.

In a specific mode of the invention, the photo-detecting semiconductor element in the state of non-conduction is a MOS transistor. Alternatively, the photo-detecting semiconductor element in the state of non-conduction is a diode element connected in a reverse bias on the current path.

(Differential sensitivity type) A semiconductor integrated circuit according to a third aspect of the invention is provided with a first circuit having a semiconductor element for sensitivity adjustment on a current path, a second circuit whose photo-detection sensitivity is adjusted by the first circuit and which has a photo-detecting semiconductor element on the current path, and a third circuit for detecting the output node level of the second circuit. The semiconductor integrated circuit further comprises a plurality of photodetectors for varying the output of the third circuit according to the output node level of the second circuit which is subject to current variations when the photo-detecting semiconductor element is irradiated with light, wherein photo-detection by the photodetectors is used for stopping internal actions. Preferably, the plurality of photodetectors should be distributively arranged in a power supply circuit and a clock generating circuit. The locations of photodetectors of the differential sensitivity type, because of their circuit form in which a feedthrough current is let flow all the time, cannot be easily known even if they are arranged within an analog circuit. It is preferable to make adjustable the current driving force of the semiconductor element for sensitivity adjustment. It would facilitate correction or optimization of the detection sensitivity.

In a specific mode of implementing the invention, for instance, the photo-detecting semiconductor element is a MOS transistor constituting the current path. Alternatively, the photo-detecting semiconductor element may be a diode element arranged in parallel on part of the current path of the second circuit, and the diode element is connected in a reverse bias. Photo-detection is further ensured by arranging a plurality of the diode elements in parallel. In this sense, it is preferable for the plurality of diode elements to be ubiquitous on the semiconductor chip of the semiconductor integrated circuit.

(Ensuring reliable photo-detection) In order to increase the current driving force or the amperage of only the photo-detecting element by irradiation with light sufficiently to distinguish it from other elements, the area of the pn junction part to be reversely biased, out of the whole pn junction of the photo-detecting semiconductor element, should be made larger than those of other junctions to make its photo-sensitivity higher than those of other similar semiconductor elements. Alternatively, a metal film or polysilicon film can be used to shade the upper layers of other semiconductor elements than the photo-detecting semiconductor element. A configuration in which, as described above, diodes can be connected in parallel, biased in a reverse direction to MOS transistors, as photo-detecting semiconductor elements, or another configuration in which the static latch is connected to the power source potential and the ground potential of the circuit via a current limiter semiconductor element can also contribute to securing the reliability of photo-detecting actions.

(Arrangement of photodetectors) The photodetectors can be arranged in gaps arising from the layout of basic cells in each circuit module. As a result, those photodetectors are arranged at random in each circuit module.

Before laying out basic cells in each circuit module, the photodetectors may be arranged in advance in a regular pattern, such as a grid shape, in each circuit module. As the photodetectors are arranged regularly in advance, it is made possible to adjust the density of the photodetectors. However, this may give rise to unnecessary gaps between the basic cells, inviting an increasing tendency of the space occupied on the chip.

In order to enable the photodetectors to be readily arranged in high density, it is advisable to use basic cells in which basic elements of the logic circuit and the photodetectors are paired.

(Optimization of photodetectors relative to circuit module) A semiconductor integrated circuit according to another aspect of the present invention holds a static latch in a first state in its initial state, and has in a memory cell array a plurality of first photodetectors which, when a photo-detecting semiconductor element in a state of non-conduction constituting the static latch in the first state is irradiated with light, are reversed into a second state, wherein photo-detection signals provided by the first photodetectors are used for stopping internal actions. The semiconductor integrated circuit is further provided, in a logic circuit module, with a plurality of second photodetectors each having a semiconductor element and a photo-detecting semiconductor element arranged in series on a current path and respectively placed in a state of conduction and in a state of non-conduction when they are operable, wherein the potential of the connection point between the semiconductor element in the state of conduction and the photo-detecting semiconductor element in the state of non-conduction varies according to the ratio between a current driving force which varies when the photo-detecting semiconductor element in the state of non-conduction is irradiated with light and the current driving force of the semiconductor element in the state of conduction, and photo-detection by the second photodetectors is used for stopping internal actions.

The semiconductor integrated circuit may also be provided with a first circuit having a semiconductor element for sensitivity adjustment on a current path, a second circuit having a photo-detecting semiconductor element on the current path, and a third circuit for detecting the output node level of the second circuit, and further provided in an analog circuit with a plurality of third photodetectors for varying the output of the third circuit according to the output node level of the second circuit which strides over the logical threshold of the third circuit according to the current which varies when the photo-detecting semiconductor element is irradiated with light, wherein photo-detection by the third photodetectors is used for stopping internal actions.

It may be also provided with a reset circuit capable of making the logical sum signal of photo-detection signals provided by individual photodetectors a reset signal. Resetting on every occasion of photo-detection would make it difficult to actively induce erroneous actions and thereby illegitimately acquire protected secret information.

An IC card according to the invention has, over a card substrate, an external interfacing section and a semiconductor integrated circuit connected to the external interfacing section.

Typical aspects of the invention disclosed in this application will be briefly described below.

Thus, photodetectors can be configured by utilizing the phenomenon that, by irradiating with light a semiconductor element which is stable in the off state of a static latch, that static latch is reversed. By incorporating static latch type photodetector into a memory array, the photodetectors can be arranged inconspicuously. Although there will be no memory cells in the parts where the photodetectors are present, normal memory functions can be ensured by using a redundant or ECC circuit.

If a configuration in which the output of a push-pull type circuit is made reversible by irradiating its semiconductor element in a state of non-conduction with light is applied to photodetectors, they can be arranged inconspicuously in a logic circuit.

If a configuration in which a current flowing in a semiconductor element for sensitivity adjustment arranged on a current path is varied in output according to a current which is varied by irradiation of the photo-detecting semiconductor element with light is applied to photodetectors, they can be arranged inconspicuously in analog circuits, such as a power supply circuit, or a clock generating circuit.

By covering the photo-detecting semiconductor element of a photodetector with metal or the like, the operation of the photodetector can be made even more reliable. Sensitivity adjustment of the photodetector can be accomplished by adjusting the square measure of the reversely biased pn junction part of the photo-detecting semiconductor element, addition of a diode or diodes, limiting the current, or W/L adjustment of MOS transistors for current comparison with photo-detecting MOS transistors.

By using the semiconductor integrated circuit in an IC card or the like, protection from card hacking by which erroneous actions of a semiconductor integrated circuit are actively induced to illegitimately acquire protected secret information can be made possible.

DETAILED DESCRIPTION OF THE PREFERRED EMBODIMENTS

Figure 1:
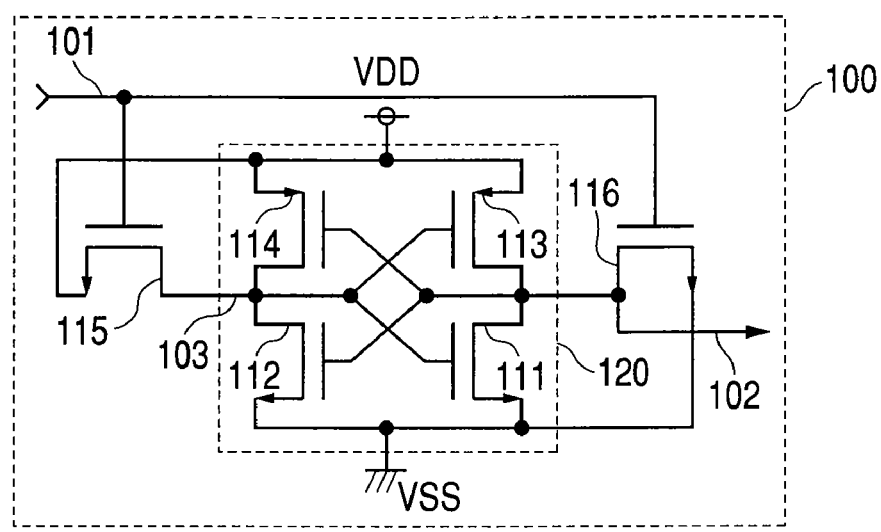
FIG. 1 is a circuit diagram illustrating an example of SRAM type photodetector, which is a first preferred embodiment of the present invention.

FIG. 1 illustrates a SRAM type photodetector 100, which is a first preferred embodiment of the present invention. As shown in FIG. 1, the SRAM type photodetector 100 has a configuration similar to that of a six-transistor type SRAM memory cell. Thus, in the six-transistor type SRAM memory cell having as its main component a static latch 120 consisting of p-channel type MOS transistors 113 and 114 and n-channel type MOS transistors 111 and 112, one of its input/output nodes is connected to a power source potential VDD via an n-channel type transfer MOS transistor MOS 115, and the other input/output node is connected to the ground potential VSS of the circuit via another n-channel type transfer MOS transistor MOS 116, the two transfer MOS transistors 115 and 116 being configured as to be switch-controlled with a reset signal passing a signal line 101.

A usual IC card is configured of a system on chip (SOC), consisting of a central processing unit (CPU), a static random access memory (SRAM), a read only memory (ROM), an electrical erasable programmable ROM (EEPROM) and so forth integrated on a single chip. Therefore, it is possible to fabricate a SRAM in the manufacturing process for IC cards and, by arranging the SRAM type photodetector 100 in the SRAM area, the presence of the photodetectors can be made inconspicuous. Needless to mention, the standby power consumption of the photodetector 100 is virtually zero.

The operation of the SRAM type photodetector 100 will be described. First at the time power supply to the IC card is turned on, the signal line 101 is linked to the reset signal. The reset signal passing the signal line 101 is raised to a high level (Hi) by the power-on resetting function, and the transfer MOS transistors 115 and 116 are turned on. As the source of the transfer MOS transistor 115 is connected to the power source potential VDD and that of the transfer MOS transistor 116 is connected to the ground potential VSS, the potential of a sensor output 102 is reset to a low level (Lo) and that of a node 103 to Hi. At this time, the MOS transistors 111 and 114 are turned on, and the MOS transistors 112 and 113, turned off. Incidence of light on the MOS transistors 112 and 113 in the off state causes the MOS transistors 112 and 113 to be turned on. If the number of incident photons is sufficiently large and the resistances of the MOS transistors 112 and 113 are less than those of the MOS transistors 111 and 114, the static latch 120 will be reversed, resulting in transition of the potential of the node 103 to Lo and that of the sensor output 102 to Hi. This action enables the irradiation with light to be detected.

While FIG. 1 shows a photodetector based on a six-transistor type SRAM memory cell, various other forms of the SRAM memory cell are proposed including a four-transistor type using a resistance load. Needless to mention, irrespective of the type of the SRAM memory cell, the photodetector can have any configuration only if it satisfies the condition that incidence of light on MOS transistors in an off state causes the static latch 120 to be reversed.

Figure 2:
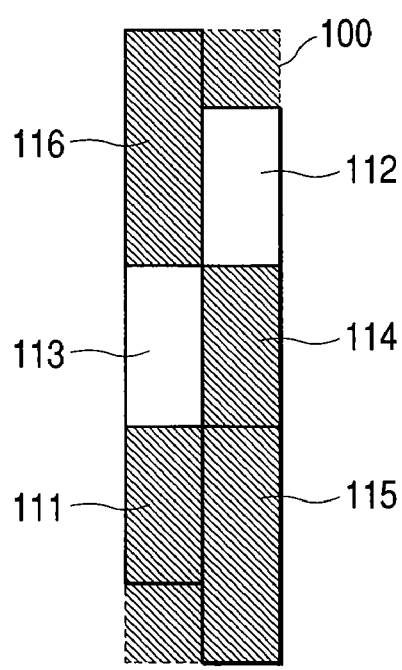
FIG. 2 illustrates an example of pattern of shading with a metal film other parts than the photo-detecting elements of the SRAM type photodetector.

If as many photons as those having come incident on the MOS transistors 112 and 113 also come incident on the MOS transistors 111 and 114, currents will also flow to the MOS transistors 111 and 114 and make it difficult for the static latch 120 to be reversed. A number of methods are conceivable to prevent it. One is to cover the top layer of the MOS transistors 111 and 114 with metal. FIG. 2 shows a schematic layout of the SRAM type photodetector 100. Usually a six-transistor type SRAM memory cell has such an arrangement as is shown in FIG. 2 to save the layout area. By covering with metal the top layer of the hatched parts, it can be ensured that no photons come incident elsewhere than on the MOS transistors 112 and 113.

Figure 3:
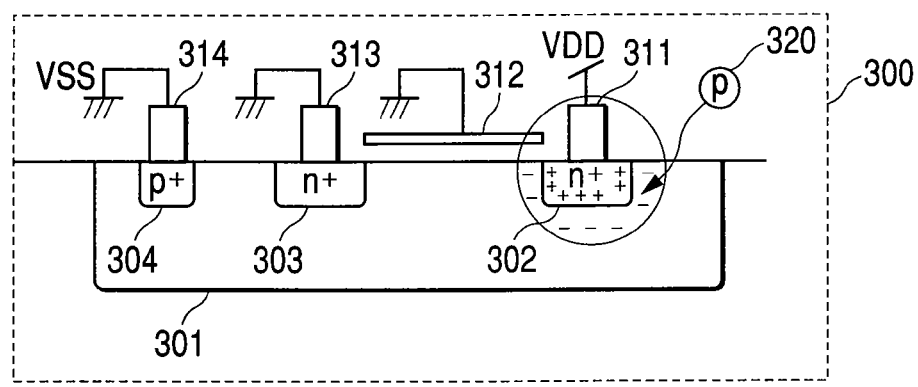
FIG. 3 illustrates the operation that takes place when photons come incident on a MOS transistor in an off state.

Instead of direct shading, the MOS transistors can be varied in photo-sensitivity. FIG. 3 shows an the n-channel type MOS transistor 300 in an off state. Reference numeral 301 denotes a p-type well diffusion region; 302, a drain diffusion region; 303, a source diffusion region; 304, a well power feed diffusion region; 311, a drain terminal; 312, a gate terminal; 313, a source terminal; 314, a substrate terminal; and 320, incident photons. The gate terminal 312, source terminal 313 and substrate terminal 314 are at the ground potential VSS, the drain terminal, at the power source potential VDD, and this MOS transistor 300 is off.

When photons having sufficient come incident on a semiconductor paired positive holes and free electrons are generated. If paired positive holes and free electrons are generated at a pn junction in a reversely biased state, the generated carriers cause currents to flow also in a reverse bias. Referring to FIG. 3, the pn junction of the p-type well diffusion region 301 and the drain diffusion region 302 are reversely biased. Therefore, a leak current resulting from the incidence of photons 320 on the n-channel type MOS transistor 300 in an off state mainly flows from the drain 311 to the substrate 314. While FIG. 3 illustrates an n-channel type MOS transistor, the same is true of a p-channel type MOS transistor.

Then, the MOS transistors 112 and 113 are laid out to have greater drain diffusion areas. If expanding their drain diffusion areas results in a greater depletion layer region at the pn junction and if photons come incident uniformly, the greater the drain areas, the greater the leak current will be. Therefore, if the drain areas of the MOS transistors 112 and 113 are laid out to be greater than those of the MOS transistors 111 and 114, even if the light coming incident on the MOS transistors 111 through 114 is the same, it will be easier for the static latch 120 to be reversed.

Needless to mention, it is possible to combine shading with metal and expanding the drain area.

Figure 4:
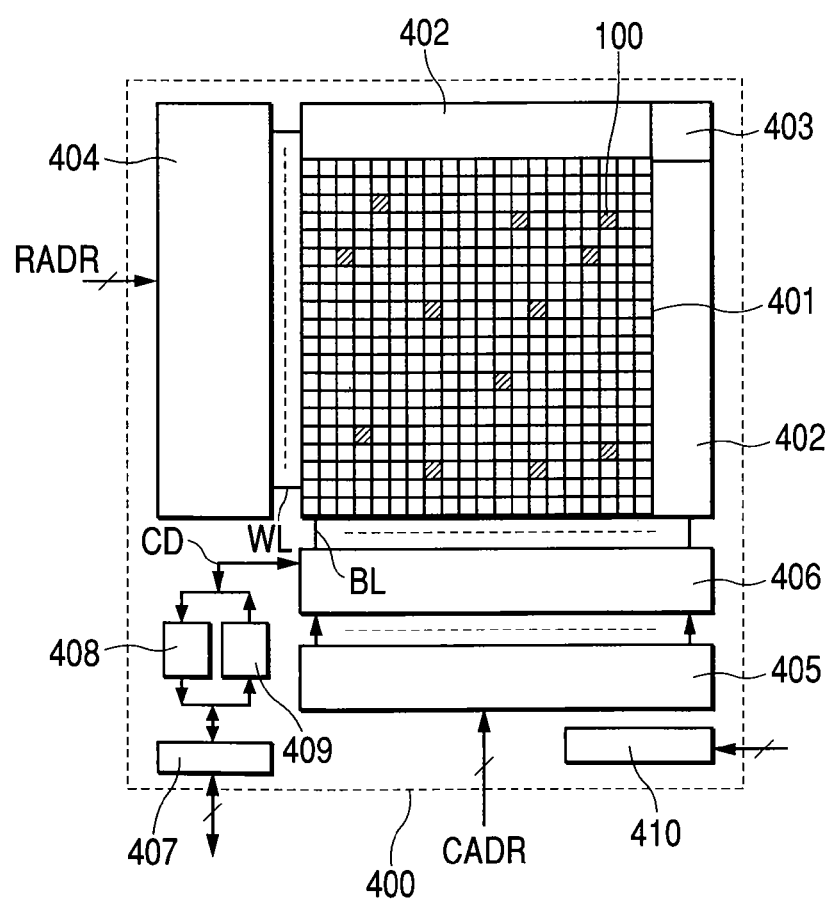
FIG. 4 is a block diagram illustrating the state of a SRAM being incorporated into a SRAM type photodetector and the overall configuration of a SRAM module.

FIG. 4 illustrates an example of arrangement in the SRAM type photodetector 100. A SRAM block 400 on the IC card, as shown in FIG. 4, has a memory cell array 401, a redundant cell array 402, a the redundant program circuit 403, a row decoder 404, a column decoder 405, a column switch array 406, an error correcting code (ECC) circuit 407, a sense amplifier 408, a write amplifier 409 and a timing generator 410. The memory cell array 401 has static memory cells arranged in a matrix, and the selection terminals of the static memory cells are connected to word lines WL row by row while the data input/output terminals of the static memory cells are connected to bit lines BL column by column. The row decoder 404 decodes a row address signal RADR to generate a word line selection signal. Complementary bit lines BL are made connectable to a common data line CD via a switch in the column switch array 406. A column address decoder decodes a column address signal CADR to select a complementary bit line BL to be made continuous to the common data line CD by using a switch in the column switch array 406.

The sense amplifier 408 senses stored information read out of a memory cell to the common data line CD, and supplies it to the ECC circuit 407. The write amplifier 409 drives the common data line CD in accordance with write information to a memory cell.

The ECC circuit 407 adds an error correction code to write data from outside, and supplies the codes-augmented data to the write amplifier 409 as write information. The ECC circuit 407 also enters read information read out of the sense amplifier 408 to the common data line CD, judges whether or not there is any error in the read data by using an error correction code accompanying the read information and, if any error is found, supplies corrected data.

The redundant cell array 402 has redundant memory cells to substitute for faulty bits in the memory cell array 401, and faulty bits are made replaceable in word line units or complementary bit line units. Faulty addresses to be replaced in word line units or complementary bit line units are set in the redundant program circuit 403, and a word line or bit line is replaced when its access address is found identical with any of the faulty addresses that are set. No detailed explanation will be made of the redundant configuration itself because it is already known to those skilled in the art.

In the memory cell array 401 of FIG. 4, each unit square in the grid represents a SRAM static memory cell (hereinafter sometimes referred to simply as SRAM cell). The shaded SRAM cells are replaced with SRAM type photodetectors 100. By arranging the SRAM type photodetectors 100 at random as shown in FIG. 4, reverse engineering can be made more difficult.

None of the SRAM type photodetectors 100 in the memory cell array 401 is connected to either the word line or the bit line of any memory cell, but the photo-detection signals 102 are supplied outside the SRAM module using a different signal wire from the bit line. Each of the photo-detection signals 102 from the plurality of SRAM type photodetectors 100 can be supplied outside via a wired OR connection or an OR gate.

A SRAM cell replaced by a SRAM type photodetector 100 can no longer be used as a memory cell, and this should create no problem to the functions of the SRAM. To prevent any such problem for occurring, the redundant cell array 402 and the redundant program circuit 403 for redundancy are utilized. Thus by replacing a memory cell in the redundant cell array 402 with a SRAM type photodetector 100, the SRAM type photodetector 100 can be arranged without adversely affecting the functions of the SRAM. Alternatively, instead of using a configuration for redundancy, by using the ECC circuit 407, any error that may resulting from the lack of the memory cell can be corrected as the sense amplifier 408 would supply a Hi level or a Lo level though the bit line replaced by the SRAM type photodetector 100 would become unstable at the time of reading. This alternative can dispense with the substitution of a photodetector element by using redundancy. Furthermore, replacement by the SRAM type photodetector 100 would not affect relieving the memory cell from its defect. In order to make possible error correction by the ECC circuit, it is necessary for the SRAM type photodetectors 100 to be distributively arranged so that the error correcting capacity of the ECC circuit be not exceeded.

Figure 5:
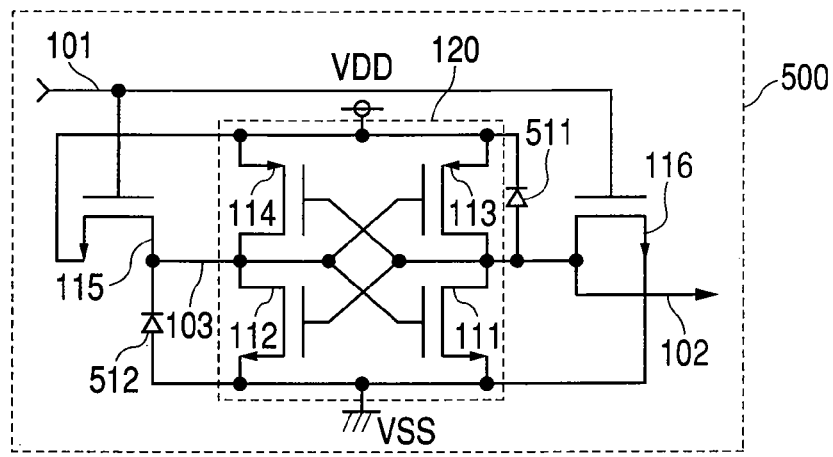
FIG. 5 is a circuit diagram of a diodes-augmented SRAM type photodetector.

FIG. 5 shows a diodes-augmented SRAM type photodetector 500, which is a second example. The diodes-augmented SRAM type photodetector 500 consists of the MOS transistors 112 and 113 of the SRAM type photodetector 100 with diodes 511 and 512 added in parallel. When shading is to be done, the diodes 511 and 512 should be exposed to light. Though this is not an absolute requirement, the diode 511 shall be composed of a p-type diffusion layer in an n-type well region, and the diode 512, of an n-type diffusion layer in a p-type well region.

Description of the basic operation will be dispensed with because it is similar to that of the SRAM type photodetector 100. The added diodes are pn junctions in parallel to the pn junctions of the drains and substrates of the MOS transistors 112 and 113. This configuration provides the same effect as the MOS transistors 112 and 113 having expanded drain areas. The use of independent diodes serves to increase the freedom of layout, and makes it possible to provide larger pn junctions than what are made available by increasing the drain areas. Since there is no absolute need for the SRAM static latch 120 and the diodes to be arranged in close proximity to each other, the freedom of layout can be further increase by laying out the diodes 511 and 512 from each other.

Figure 6:
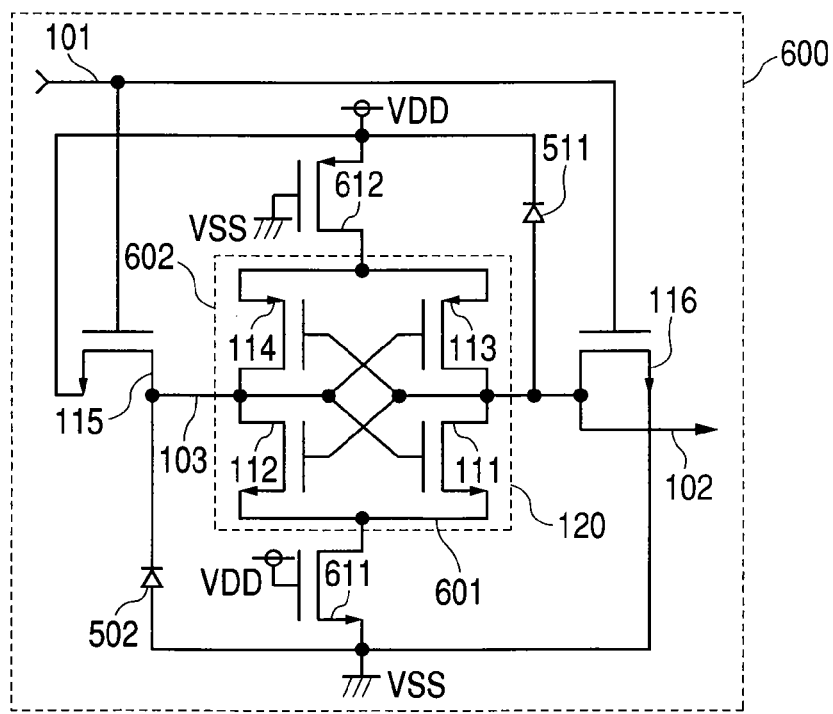
FIG. 6 is a circuit diagram of a current limiters-augmented SRAM type photodetector.

FIG. 6 shows a current limiters-augmented SRAM type photodetector 600, which is a third example. The current limiters-augmented SRAM type photodetector 600 consists of the diodes-augmented SRAM type photodetector 500 with current limiter MOS transistors 611 and 612 being added to the power source potential VDD and ground VSS of the SRAM latch.

The operation of the current limiters-augmented SRAM type photodetector 600 will be described. First, as in the SRAM type photodetector 100, the reset signal passing the signal line 101 is raised to Hi by the power-on resetting function, and the transfer MOS transistors 115 and 116 are turned on. As the source of the transfer MOS transistor 115 is connected to the power source potential VDD and that of the transfer MOS transistor 116 is connected to the ground potential VSS, the potential of the sensor output 102 is reset to Lo and that of the node 103 to Hi. At this time, the MOS transistors 111 and 114 are turned on and the MOS transistors 112 and 113, turned off. Incidence of light on the MOS transistors 112 and 113 in the off state causes the MOS transistors 112 and 113 to be turned on. As the MOS transistors 111 and 114 are in the on state then, currents will flow to all the MOS transistors 111 through 114 constituting the static latch 120, and a direct current is generated in the static latch 120. The flow of the direct current causes the drain potential of the current limiter MOS transistor 611 to rise and that of the current limiter MOS transistor 612 to fall. This effect causes the source voltage supplied to the static latch 120 to fall, making it easier for the latch to be reversed. That is to say, the sensitivity of the photodetector to the number of photons increases. While the photosensitivities of the SRAM type photodetector 100 and of the diodes-augmented SRAM type photodetector 500 are basically adjusted by varying the areas of pn junctions, that of this current limiters-augmented SRAM type photodetector 600 can be adjusted by varying the current driving forces of the current limiter MOS transistors 611 and 612, and the designing is facilitated accordingly.

Configurations of photodetectors based on SRAM cells have been described so far. SRAMs are used as work areas in an IC card, and often made the targets of reverse engineering. It is therefore important to embed photodetectors in a SRAM array and thereby to make reverse engineering difficult. Another conceivable way of reverse engineering is to induce erroneous actions in flip-flops in the CPU section. To guard against it, photodetectors complying with the requirements of standard logic cells (in terms of cell height, width and so forth) would be convenient. Of course, there will be no problem if the SRAM type photodetectors are laid out in compliance with the requirements of standard logic cells, but a circuit form better fitting standard logic cells, if any, would be even better. The following description of a configuration of the photodetector will presuppose a layout meeting the requirements of standard logic cells.

Figure 7:
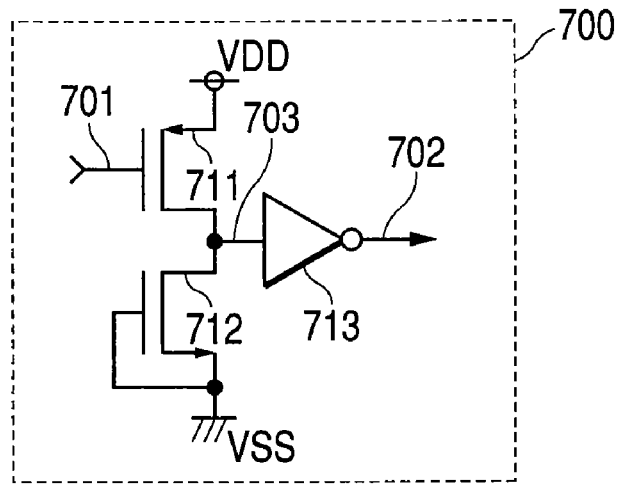
FIG. 7 is a circuit diagram of an inverter type photodetector.

FIG. 7 shows an inverter type photodetector 700, which is a fourth example. Reference numeral 701 denotes a negative logic enable signal; 702, a detector output signal; 703, a sensor signal; 711, a sensitivity adjusting MOS transistor; 712, a photo-detecting MOS transistor; 713, an output inverter; VDD, a power source potential; and VSS, a ground potential.

The inverter type photodetector 700 is actuated by a fall of the negative logic enable signal 701 to Lo and the turning-on of the sensitivity adjusting MOS transistor 711. When no photons are coming incident, the photo-detecting MOS transistor 712 is off because its gate and source are short-circuited. Therefore, when no photons are coming incident, the sensor signal 703 is at the power source potential and the detector output 702, at the ground potential VSS. When photons come incident on the photo-detecting MOS transistor 712, a current flows and the sensor signal 703 falls according to the ratio of the current driving force. When the number of photons reaches or surpasses a certain level and the potential of the sensor signal 703 falls below the logical threshold voltage of the output inverter 713, the detector output 702 rises to Hi and light is detected.

Figure 8:
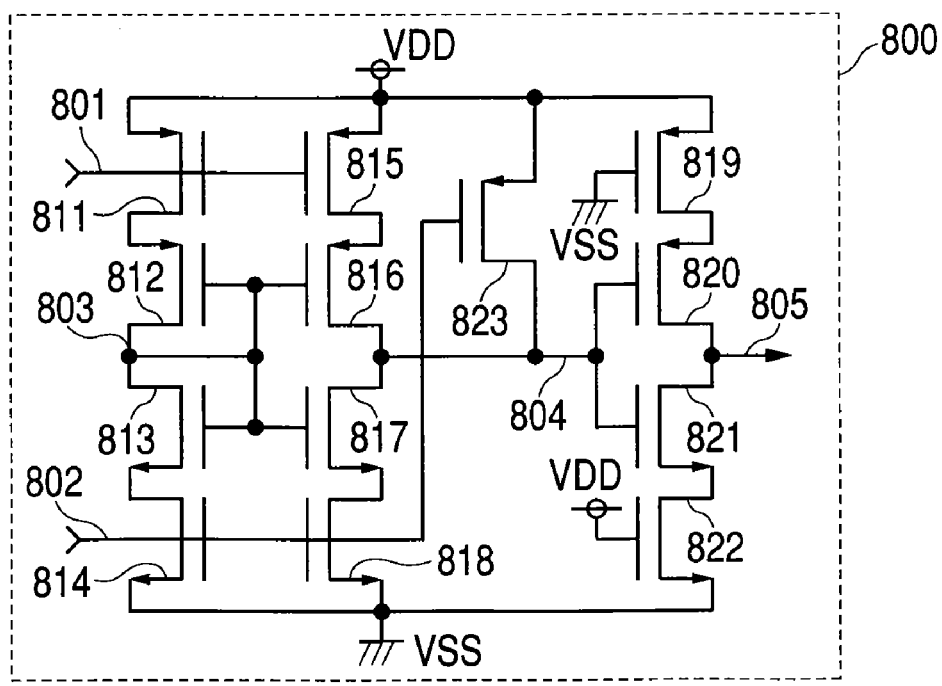
FIG. 8 is a circuit diagram of a biased inverter type photodetector.

FIG. 8 illustrates a biased inverter type photodetector 800, which is a fifth example. Reference numeral 801 denotes a negative logic enable signal; 802, a positive logic enable signal; 803, a bias node; 804, a sensor signal; 805, a detector output signal; 811, 815 and 819, p-channel type current limiting MOS transistors; 814, 818 and 822, n-channel type current limiting MOS transistors; 813 and 821, n-channel type sensitivity controlling MOS transistors; and 817, an n-channel type photo-detecting MOS transistor. Of these elements, only the photo-detecting MOS transistor 817 is exposed to light, and other elements are masked with metal films. The W and L values of the MOS transistors here are designed to be 811=815=819, 812=816=820, 813=821 and 814=818=822.

When the negative logic enable signal 801 is Hi and the positive logic enable signal 802 is Lo, the biased inverter type photodetector 800 is off. The MOS transistors 811, 814, 815 and 818 prevent currents from flowing, and the sensor signal 804 is pulled up by a MOS transistor 823, and the detector output signal 805 is fixed at the ground potential VSS.

When the negative logic enable signal 801 is switched to Lo and the positive logic enable signal 802 to Hi, the biased inverter type photodetector 800 is actuated, and the potential of the bias node 803 is determined by a negative feedback of a clocked inverter type bias circuit composed of the MOS transistors 811 through 814. As the W and L values of the MOS transistors then are designed to be 811=819, 812=820, 813=821 and 814=822, the potential of the bias node 803 is equal to the logical threshold of an inverter composed of the MOS transistors 819 through 822. Here again, if the MOS transistor 813 is designed to be equal to 817, the potential of the sensor signal 804 should be equal to the potential of the bias node 803. The actual W/L values are set to be higher for the MOS transistor 813 than for 817. In order to eliminate the impact of the short channel effect, it is preferable to equalize L between the two MOS transistors and to give a greater W value to 813 than to 817. This design results in a higher potential of the sensor signal 804 than that of the bias node 803 because of the difference between the MOS transistors 813 and 817 in current driving force, and the detector output signal 805 is thereby stabilized in the vicinity of the ground potential.

When photons come incident on the photo-detecting MOS transistor 817, a leak current generates between the drain and the substrate of the photo-detecting MOS transistor 817. Then, as there arises an increase in current, the potential of the sensor signal 804 falls. The number of photons increases and, when the potential of the sensor signal 804 becomes less than the logical threshold of an inverter composed of the MOS transistors 819 through 822, there occurs a transition of the detector output signal to Hi.

A characteristic of this biased inverter type photodetector 800 consists in the ease of adjustment of the sensitivity of photo-detection by properly setting the W/L difference between the n-channel type MOS transistors 813 (=821) and 817. As long as this biased inverter type photodetector 800 is operating, a current keeps on flowing, but the power consumption can be reduced to a negligible level relative to the power consumption of the whole IC card by setting low the W/L values of the p-channel type current limiting MOS transistors 811, 815 and 819 and of the n-channel type current limiting MOS transistors 814, 818 and 822.

Figure 9:
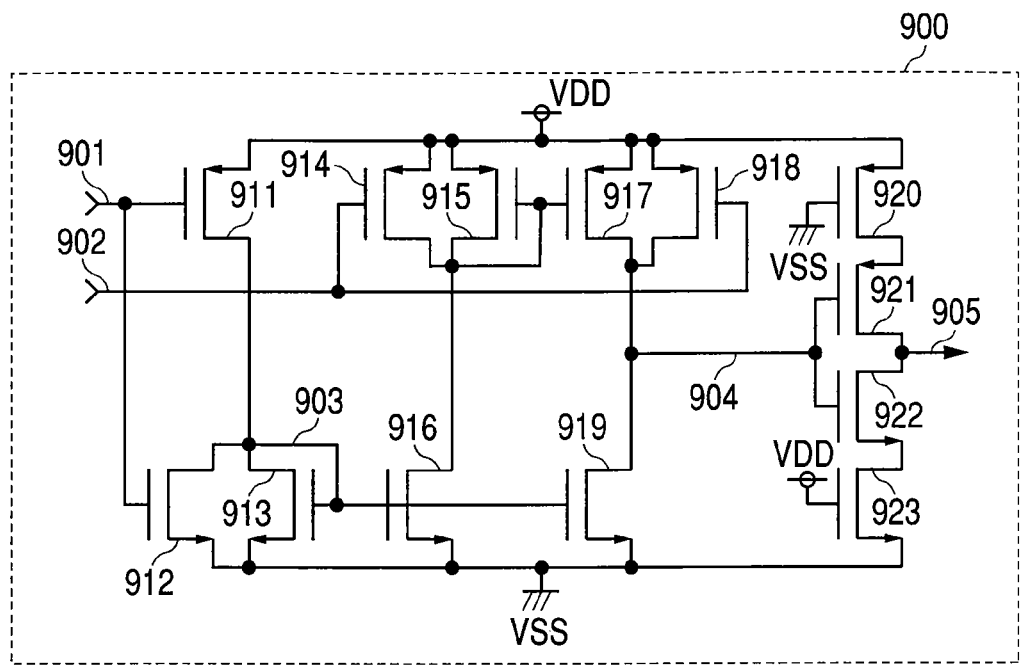
FIG. 9 is a circuit diagram of a current mirror type photodetector.

FIG. 9 illustrates a current mirror type photodetector 900, which is a sixth example. Reference numeral 901 denotes a negative logic enable signal; 902, a positive logic enable signal; 903, a bias node; 904, a sensor signal; 905, a detector output signal; 911, a p-channel type power source MOS transistor; 913, an n-channel type bias MOS transistor; 915 and 917, MOS transistors constituting current mirrors; 916, an n-channel type sensitivity adjusting MOS transistor; 919, an n-channel type photo-detecting MOS transistor; 920 through 923, current limiting inverters; 912, an n-channel type pull-down MOS transistor; and 914 and 918, p-channel type pull-down MOS transistors. Of these elements, only the photo-detecting MOS transistor 919 is exposed to light, and other elements are masked with metal films.

When the negative logic enable signal 901 is Hi and the positive logic enable signal 902 is Lo, the current mirror type photodetector 900 is off. the pull-down MOS transistor 912 prevents currents from flowing to the MOS transistors 913, 916 and 919, the sensor signal 904 is pulled down by the pull-down MOS transistor 918, and the detector output signal 905 is fixed at the ground potential VSS.

When the negative logic enable signal 901 is switched to Lo and the positive logic enable signal 902 to Hi, the current mirror type photodetector 900 is actuated. The current flowing to the power source MOS transistor 911 flows to the bias MOS transistor 913 to determine the potential of the bias node 903. If here the W and L values of the sensitivity adjusting MOS transistor 916 and of the photo-detecting MOS transistor 919 are the same, currents of the same amperage will flow to the two MOS transistors, but actually the W level of the sensitivity adjusting MOS transistor is designed to be greater so that a current of a greater amperage flow to the sensitivity adjusting MOS transistor 916. The amperage difference between the two MOS transistors is amplified by a current mirror active load composed of the MOS transistors 915 and 917. If the channel length modulation coefficients of the MOS transistors 915 and 917 are sufficiently small, the sensor output 904 will be stabilized in the vicinity of the power source potential VDD, and the detector output signal 905, in the vicinity of the ground potential VSS.

When photons come incident on the photo-detecting MOS transistor 919, a leak current generates between the drain and the substrate of the photo-detecting MOS transistor 919. Then, currents will increase. When the current flowing to the photo-detecting MOS transistor 919 surpasses that flowing to the sensitivity adjusting MOS transistor 916, the current mirror active load functions to bring down the potential of the sensor signal 904 to the vicinity of the ground potential VSS. This results in a transition of the detector output signal 905 to the Hi level to enable irradiation with light to be detected.

The sensitivity of photo-detection by this the current mirror type photodetector 900, too, can be readily adjusted by properly setting the W/L difference between the sensitivity adjusting MOS transistor 916 and the photo-detecting MOS transistor 919. Although a current also keeps on flowing in this circuit as long as it is operating, the power consumption can be reduced to a negligible level relative to the power consumption of the whole IC card by appropriately adjusting the W/L values of the bias circuit composed of the MOS transistors 911 and 913 and of the MOS transistors 920 and 923 limiting the current flowing to the output inverter.

Figure 10:
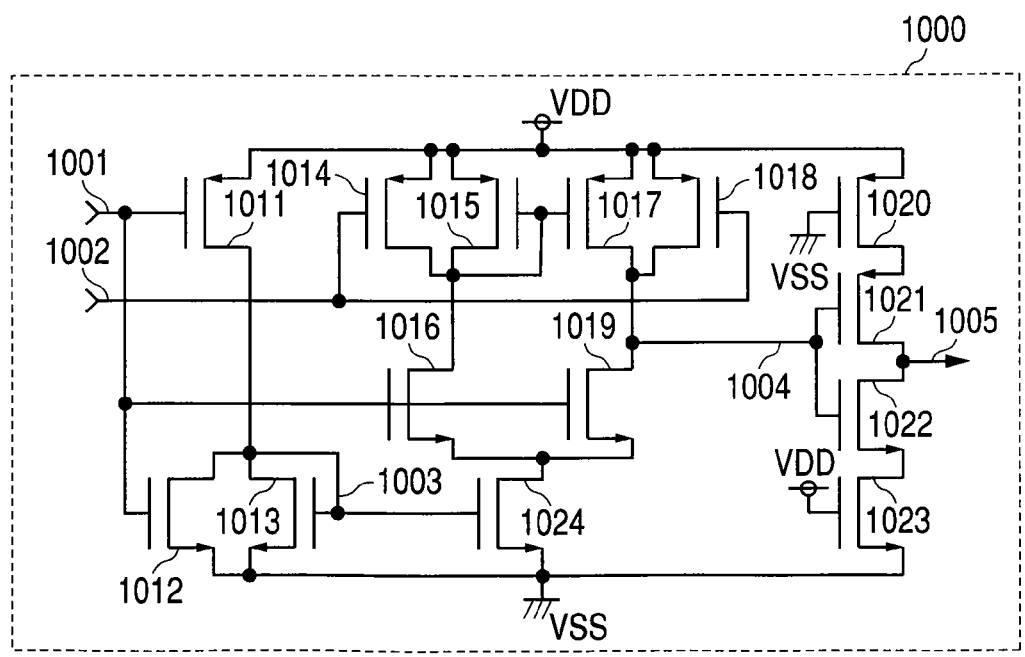
FIG. 10 is a circuit diagram of a differential AMP-type photodetector.

FIG. 10 illustrates a differential AMP-type photodetector 1000, which is a seventh example. Reference numeral 1001 denotes a negative logic enable signal; 1002, a positive logic enable signal; 1003, a bias node; 1004, a sensor signal; 1005, a detector output signal; 1011, a p-channel type power source MOS transistor; 1013, an n-channel type bias MOS transistor; 1024, an n-channel type power source MOS transistor; 1015 and 1017 MOS transistors constituting a current mirror load; 1016, an n-channel type sensitivity adjusting MOS transistor; 1019, an n-channel type photo-detecting MOS transistor; 1020 through 1023, current limiting inverters; 1012, an n-channel type pull-down MOS transistor; and 1014 and 1018, p-channel type pull-down MOS transistors. Of these elements, only the photo-detecting MOS transistor 1019 is exposed to light, and other elements are masked with metal films.

When the negative logic enable signal 1001 is Hi and the positive logic enable signal 1002 is Lo, the differential AMP-type photodetector 1000 is off. The pull-down MOS transistor 1012 prevents a current from flowing to power source MOS transistor 1024, the sensor signal 1004 is pulled up by the pull-up MOS transistor 1018, and the detector output signal 1005 is fixed at the ground potential VSS.

When the negative logic enable signal 1001 is switched to Lo and the positive logic enable signal 1002 to Hi, the differential AMP-type photodetector 1000 is actuated. The current flowing to the power source MOS transistor 1011 flows to the bias MOS transistor 1013 to determine the potential of the power source MOS transistor 1024 by the current mirror. If here the W and L values of the sensitivity adjusting MOS transistor 1016 and of the photo-detecting MOS transistor 1019 are the same, currents of the same amperage will flow to the two MOS transistors, but actually the W level of the sensitivity adjusting MOS transistor is designed to be greater so that a current of a greater amperage flow to the sensitivity adjusting MOS transistor 1016. The amperage difference between the two MOS transistors is amplified by a current mirror active load composed of the MOS transistors 1015 and 1017. If the channel length modulation coefficients of the MOS transistors 1015 and 1017 are sufficiently small, the sensor output 1004 will be stabilized in the vicinity of the power source potential VDD, and the detector output signal 1005, in the vicinity of the ground potential VSS.

When photons come incident on the photo-detecting MOS transistor 1019, a leak current generates between the drain and the substrate of the photo-detecting MOS transistor 1019. Then, currents will increase. When the current flowing to the photo-detecting MOS transistor 1019 surpasses that flowing to the sensitivity adjusting MOS transistor 1016, the current mirror active load functions to bring down the potential of the sensor signal 1004 to the vicinity of the ground potential VSS. This results in a transition of the detector output signal 1005 to the Hi level to enable irradiation with light to be detected.

This differential AMP-type photodetector 1000, like the current mirror AMP-type photodetector 900, is characterized by the ease of adjusting photo-sensitivity by properly setting the W difference between the sensitivity adjusting MOS transistor 1016 and the photo-detecting MOS transistor 1019. An advantage over the current mirror AMP-type photodetector 900 and others is the higher drain potential of the photo-detecting MOS transistor 1019. Each photodetector detects the incidence of light by detecting the leak current generating in the pn reverse bias between the drain and the substrate of the photo-detecting MOS transistor. If the drain potential is low, the electric field in the depletion layer will be weak, and the probability for the paired positive holes and free electrons generated by the incidence of photons to become recombined before passing the depletion layer will increase. The differential AMP-type photodetector 1000 strengthens the electric field between the drain and the substrate of the photo-detecting MOS transistor 1019 and increase photo-sensitivity by raising the drain potential between the drain and the substrate. Also in the differential AMP-type photodetector 1000, a current keeps on flowing as long as it is operating, the power consumption can be reduced to a negligible level relative to the power consumption of the whole IC card by appropriately adjusting the W/L values of the bias circuit composed of the MOS transistors 1011 and 1013 and of the MOS transistors 1020 and 1023 limiting the current flowing to the output inverter.

Figure 11:
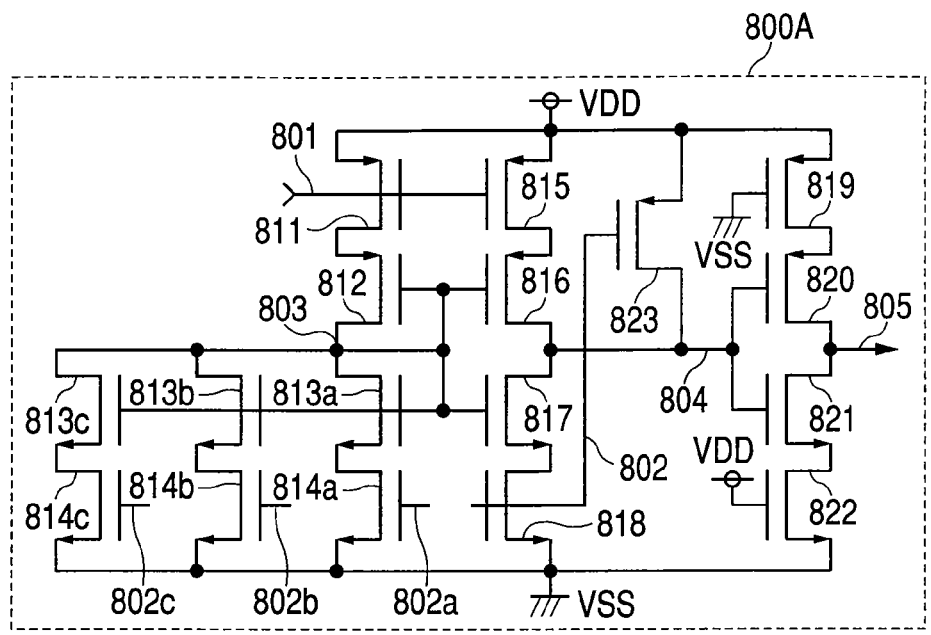
FIG. 11 is a circuit diagram of a modified version of the biased inverter type photodetector 800 shown in FIG. 8.

FIG. 11 illustrates a modified version of the biased inverter type photodetector 800 shown in FIG. 8. A biased inverter type photodetector 800A shown in FIG. 11 permits adjustment of the current power capacity of the element for sensitivity control. Thus, it differs from the configuration shown in FIG. 8 that a series circuit of a sensitivity controlling MOS transistor 813a and a current limiting MOS transistor 814a, another of a sensitivity controlling MOS transistor 813b and a current limiting MOS transistor 814b and still another of a sensitivity controlling MOS transistor 813c and a current limiting MOS transistor 814c are arranged in parallel. The W and L values of the MOS transistors are such as 814a=814b=814c=814. The L values of the MOS transistors 813a, 813b and 813c are the same as that of the MOS transistor 817, and $W_{813a}$, $W_{813b}$ and $W_{813c}$ of the MOS transistor 813a, 813b and 813c are set relative to $W_{81}7$ of the MOS transistor 817 to be, for instance, $W_{813a}=3 \cdot W_{817}/4$, $W_{813b}=1 \cdot W_{817}/8$, and $W_{813c}=1 \cdot W_{817}/16$. When the control signal 802 is raised to Hi to make the biased inverter type photodetector 800 operable, the current drive capacity of the element for sensitivity control differs depending on which of selection signals 804a, 804b and 804c is raised to Hi, making it possible to set as desired the difference in initial potential of the sensor signal 804 relative to the bias node 803. The selection signals 804a, 804b and 804c can be determined with the value of a register (not shown). This facilitates correction or optimization of the detection sensitivity.

Figure 12:
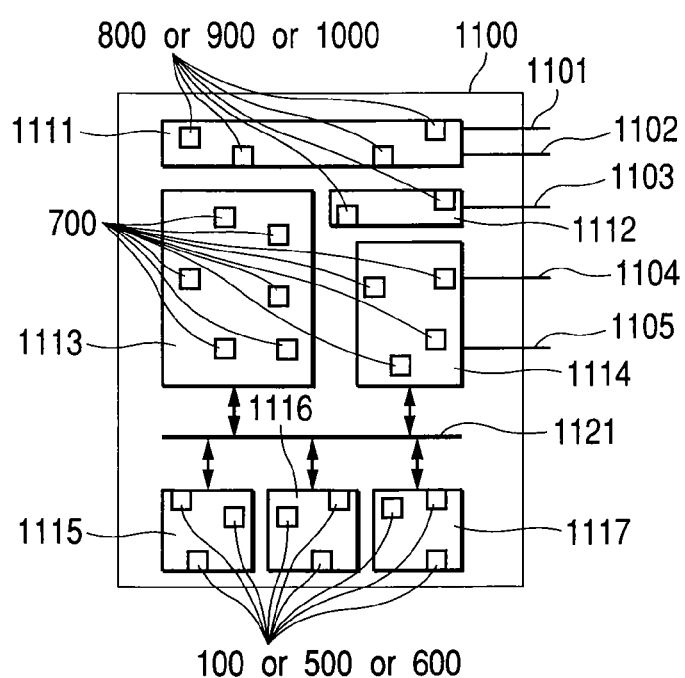
FIG. 12 is a block diagram illustrating a schematic configuration of an IC card microcomputer into which various photodetectors are incorporated.

FIG. 12 illustrates a microcomputer for IC card use (hereinafter sometimes referred to simply as IC card microcomputer) as a semiconductor integrated circuit for IC card use. Here is described how the various photodetectors are applied to the IC card microcomputer. Reference numeral 1100 denotes an integrated circuit module (ICM) of an IC card, such as an IC card microcomputer; 1101, a power source terminal; 1102, a ground terminal; 1103, a clock input terminal; 1104 and 1105, I/O terminals; 1111, a power source block; 1112, a phase-locked loop (PLL) block; 1113, a CPU-containing logic circuit block; 1114, an interface block; 1115, a SRAM; 1116, a ROM; 1117, an EEPROM; and 1121, an internal data bus.

The ROM 1116 holds a CPU control program in the CPU-containing logic circuit block 1113, and the EEPROM 1117 holds control data and the like rewritably. The SRAM 1115 is used as a work area or the like for the CPU in the CPU-containing logic circuit block 1113. The PLL 1112 generates an internal clock on the basis of an external supplied from the clock input terminal 1103.

Since none of the individual external terminals of an IC card is usually required to be adaptive to high speed, the IC card microcomputer uses an interface working on a traditional 5 V power supply. For this reason, the IC card microcomputer 1100 is supplied with 5 V power. However, since 5 V power is too high for an IC even finer than a deep submicron process, there will be needed a step-down power source for supplying each circuit with power of an appropriate voltage. Furthermore, as the EEPROM 1117 requires a voltage higher than 5V and lower than the ground potential for erasing/writing data in or into the memory, step-up power source/negative voltage power supply circuits each using a charge pump or the like will be needed. A block putting together power supply circuits is the power source block 1111. The power source block 1111 is configured mainly of analog circuits. For this reason, the biased inverter type photodetector 800, the current mirror type photodetector 900, the differential AMP-type photodetector 1000 and so forth mentioned above can be incorporated inconspicuously. "Inconspicuous" here means difficulty to distinguish photodetectors of a circuit configuration in which a constant current is let flow inserted therein from other circuit configurations around because of their analog circuitry.

Since the CPU-containing logic circuit block 1113 is built into the IC card microcomputer 1100, the PLL block 1112 is required. As the PLL block 1112 has an analog circuit configuration, it allows the biased inverter type photodetector 800, the current mirror type photodetector 900, the differential AMP-type photodetector 1000 and the like to be incorporated inconspicuously.

Since the CPU-containing logic circuit block 1113 and the interface block 1114 are configured mainly of digital circuits, it is appropriate to use the inverter type photodetector 700. "Appropriate" here means that the insertion of the photodetector of a push-pull configuration is difficult to distinguish from other circuit configurations around because of their digital circuitry.

As the SRAM 1115, the ROM 1116 and the EEPROM 1117 are memory elements, it is appropriate to use the SRAM type photodetector 100, the diodes-augmented SRAM type photodetector 500, the current limiters-augmented SRAM type photodetector 600 and the like. "Appropriate" here means that, because the photodetectors have a circuit configuration resembling that of memory cells, they cannot be easily distinguished from the memory cells around. Although it is not appropriate to let the ROM 1116 and the EEPROM 1117 be mixed in the memory array because their memory cell configurations are different from that of the SRAM, the buffer for temporarily storing data to be written into memory cells or data read out of memory cells can be configured as SRAM memory cells, among which SRAM type photodetectors can be present mixed with others.

Photo-detection signals provided by various photodetectors give, for instance logical sums, and a logical signal is considered on of the reset signals (master reset signals) of the IC card microcomputer. This makes it impossible, even data collection for reverse engineering is attempted by irradiation with light, to cancel the reset because IC card microcomputer is subjected to master resetting and returned to its initial state every time. As a result, any attempt at illegitimate data collection by irradiation with light would stop the operation of the IC card, and statistical analysis of the cryptographic key or the like can be thereby prevented.

In this way, reverse engineering can be prevented more effectively by incorporating different kinds of photodetectors to match the characteristics of the circuit block.

Various methods are conceivable for incorporating the photodetectors. A first preferable method is to incorporate them into gaps created by the arrangement of elements, and a second is to incorporate them in a grid-shaped pattern.

Figure 13:
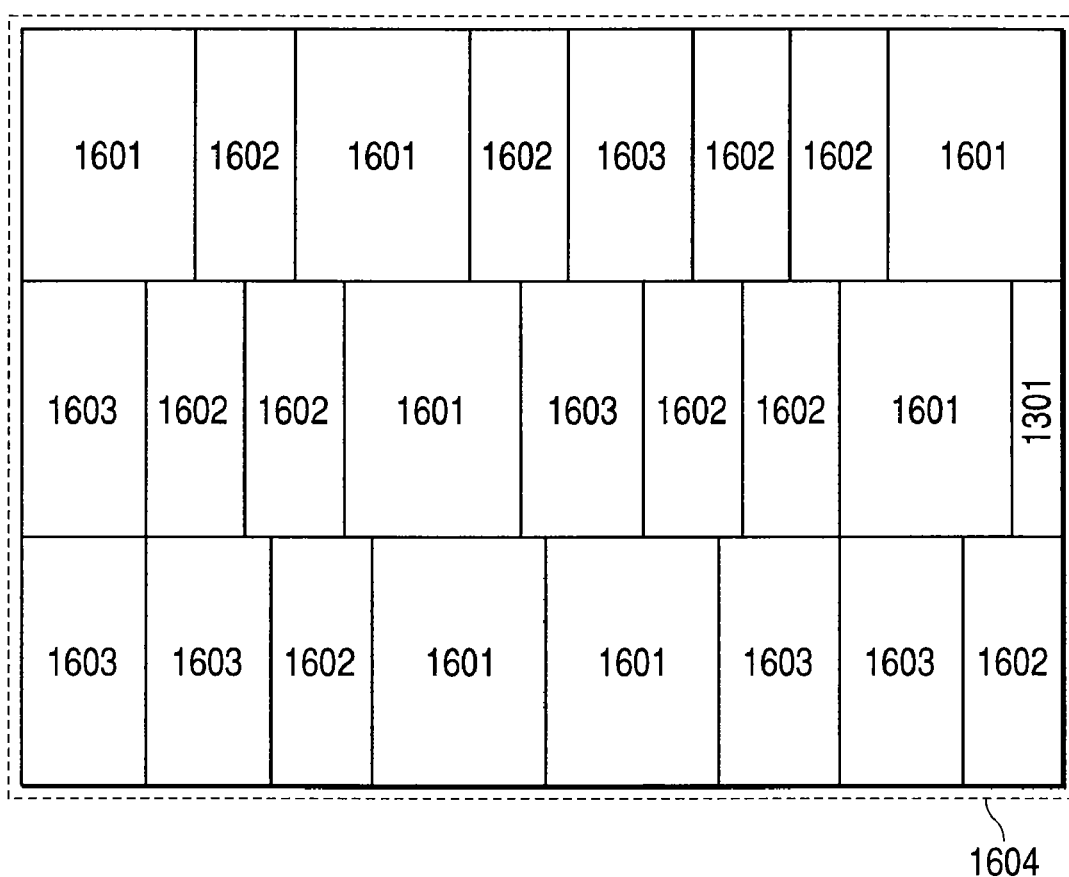
FIG. 13 shows a layout of a typical state in which photodetectors are incorporated into gaps in the element arrangement of functional blocks.

FIG. 13 shows a layout of a typical state in which photodetectors are incorporated into gaps in the element arrangement of functional blocks. For instance, one functional block 1604 is so arranged to enable first basic cells 1601 which may be D-type latch circuits, second basic cells 1602 which may be NAND gates and third basic cells 1603 which may be inverters to perform their respective functions, and a photodetector 1301 is arranged in the resultant gap. Generally speaking, digital circuits are caused to configure a functional block 1604 by arranging basic cells 1601, 1602 and 1603. While the heights of the basic cells 1601 through 1603 are equalized to facilitate their arrangement, the cells differ in width, resulting in inevitable gaps when configuring a functional block. Usually, either nothing is arranged in such gaps or gap cells are arranged therein. By arranging therein photodetectors 1301, the photodetectors 1301 can incorporated into many functional blocks without increasing the square measure.

Figure 14:
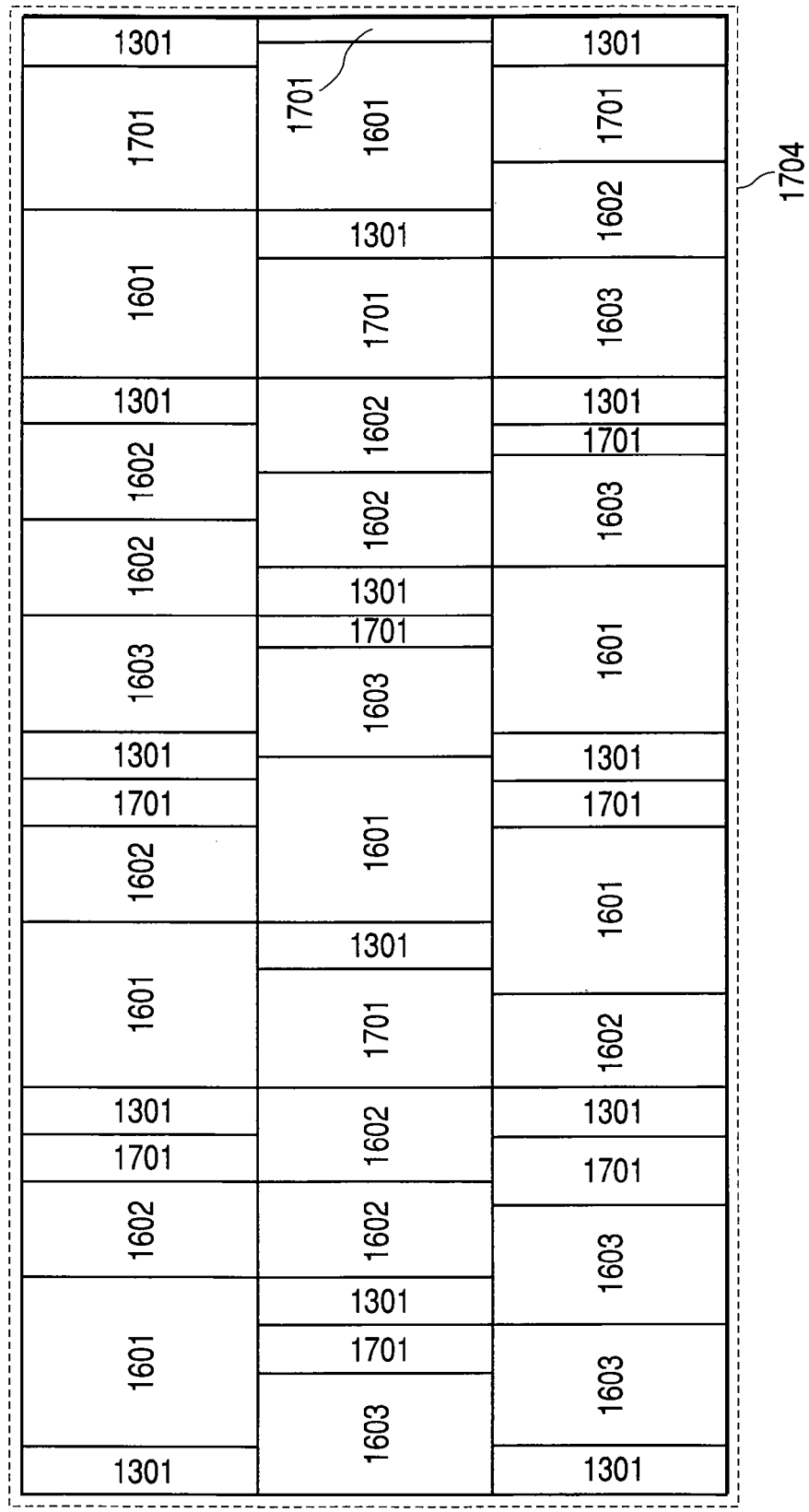
FIG. 14 shows a layout of a typical state in which photodetectors are incorporated into functional blocks in a grid-shaped pattern.

FIG. 14 shows a layout of a typical state in which photodetectors are incorporated into functional blocks in a grid-shaped pattern. The photodetectors 1301 are arranged in advance in functional blocks 1704 which should be protected from reverse engineering with particular care. The arrangement for that purpose here is in a grid shape. By this technique, since basic cells 1601 through 1603 are arrangement in gaps between photodetectors 1301, there are formed many cell gaps 1701, but this arrangement is superior in its capability to prevent reverse engineering because the density of the photodetectors 1301 can be adjusted.

Figure 15:
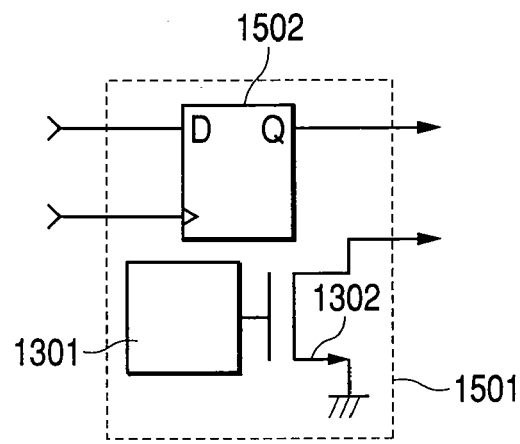
FIG. 15 is a circuit diagram of a typical basic cell in which a photodetector is incorporated with a D-type flip-flop.

FIG. 15 illustrates a typical basic cell in which a photo-detecting circuit is incorporated with a D-type flip-flop. If prevention of reverse engineering is to be given particular priority, photodetectors can be incorporated in advance into basic elements (flip-flop, NAND, NOR, inverter and so forth) of the logic circuit, and their use would facilitate arrangement of photodetectors in high density.

The basic cell 1501 of which an example is shown in FIG. 15 is matched to a basic element of a D-type flip-flop, and consists of a D-type flip-flop 1502, a photo-detecting circuit 1301 and a wired OR coupling element 1302. The photodetector to be used in this case consumes almost no electric power, and therefore serves to keep the square measure small. Since the inverter type photodetector 700 is the most suitable in this respect, the inverter type photodetector 700 will be used as the photo-detecting circuit 1301. The drain of the wired OR coupling element 1302 may be coupled to the drain of the wired OR coupling element provided in some other basic cell.

Figure 16:
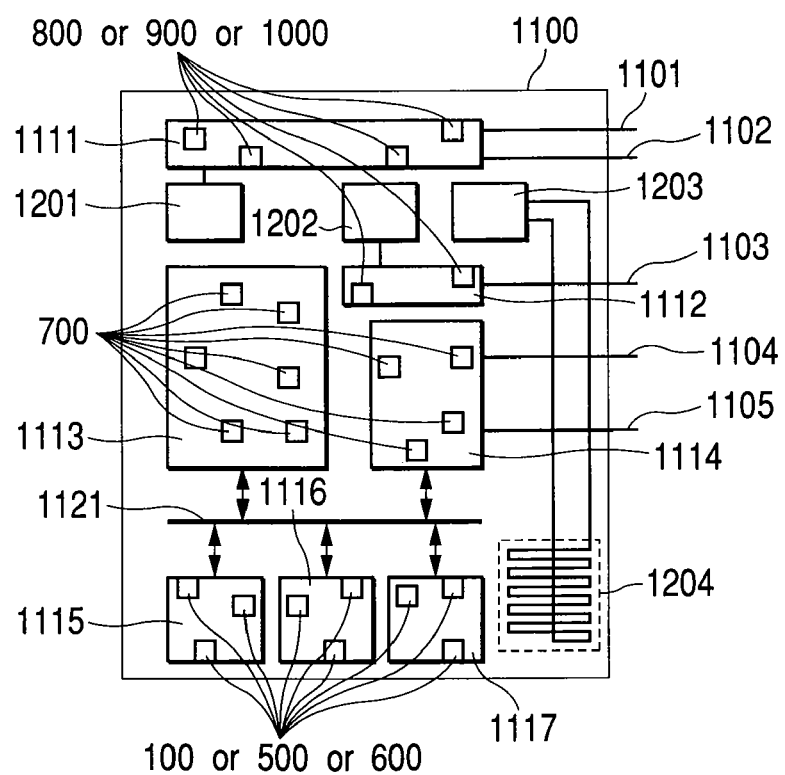
FIG. 16 is an overall block diagram of an IC card microcomputer to which voltage detecting, frequency detecting and wiring cutoff detecting functions are added to the photo-detection function by a photodetector.

FIG. 16 shows an example of an IC card microcomputer to which voltage detecting, frequency detecting and wiring cutoff detecting functions are added to the photo-detection function by a photodetector. It differs from the configuration shown in FIG. 12 in that a voltage detecting circuit 1201, a frequency detecting circuit 1202, a wiring cutoff detecting circuit 1203 and active shield wiring (in a rigid frame pattern) 1204 are added.

The voltage detecting circuit 1201 detects any fall beyond a prescribed limit in internal operating power supply generated by a power source block 1111. The voltage detecting circuit 1201 is used for any anticipated reengineering analysis done by applying an abnormal stepped-down voltage to an internal power supply node via a probe thereby giving rise to an abnormal operation, and for detecting it.

The frequency detecting circuit 1202 detects any surpassing of a prescribed by the frequency of an internal clock generated by the PLL 1112. The frequency detecting circuit 1202 is used for any anticipated reengineering analysis done by applying an abnormally high frequency to an internal clock supplying node via a probe thereby giving rise to an abnormal operation, and for detecting it.

Figure 17:
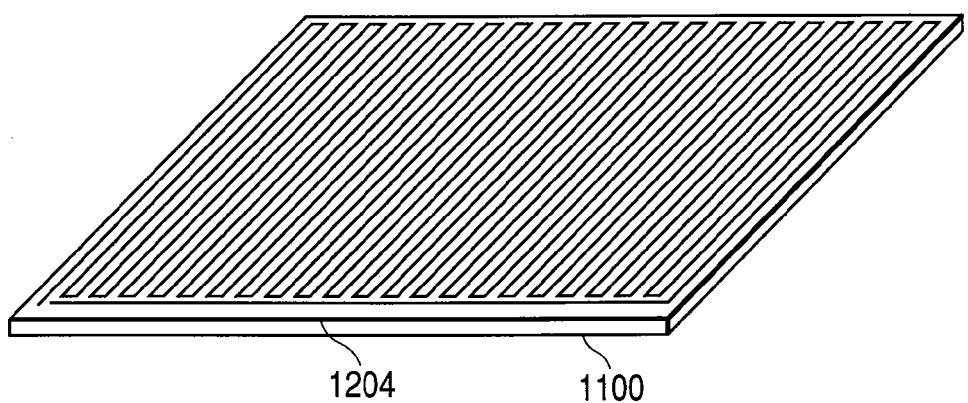
FIG. 17 shows how active shield wiring is laid all over the surface of an IC card microcomputer as a fine pattern.

The wiring cutoff detecting circuit 1203 detects any cutoff of the active shield wiring (in a rigid frame pattern) 1204 arranged on the surface of the IC card microcomputer. The active shield wiring 1204 is so laid, as shown in FIG. 17 by way of example, as to draw a fine pattern all over the surface of the IC card microcomputer. If it is attempted to remove the surface protective film or the like of the IC card microcomputer to bring a probe into contact with an internal node of the IC card microcomputer, the active shield wiring (in a rigid frame pattern) 1204 will also be cut off, and it is intended to detect this cutoff.

Figure 18:
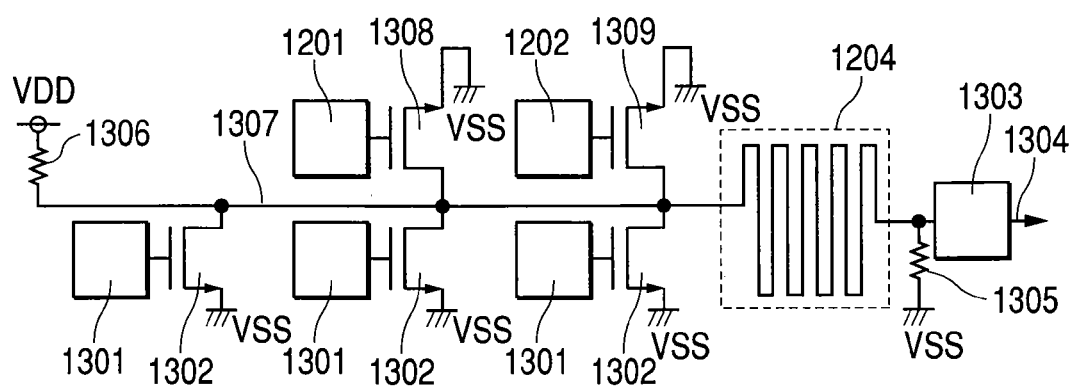
FIG. 18 illustrates an example of circuit configuration for integrally generating a reset signal in response to photo-detection by a photodetector, voltage detection, frequency detection and wiring cutoff detection.

FIG. 18 illustrates an example of circuit configuration for integrally generating a reset signal in response to photo-detection by a photodetector, voltage detection, frequency detection and wiring cutoff detection. Reference numeral 1301 denotes a photo-detecting circuit which generically represents many different forms of photo-detecting circuit; 1302, a wired OR element, such as a MOS transistor, for receiving at its selection terminal a detection signal from the photo-detecting circuit 1301; 1308, another wired OR element, such as a MOS transistor, for receiving at its selection terminal a detection signal from the voltage detecting circuit 1201; 1309, still another wired OR element, such as a MOS transistor, for receiving at its selection terminal a detection signal from the frequency detecting circuit 1202; 1303, a reset circuit; 1304, a reset signal; 1305, a pull-down resistor; 1306, a pull-up resistor; and 1204, the active shield wiring. The wired OR elements 1301, 1308 and 1309, the pull-up resistor 1306, the pull-down resistor 1305, and the active shield wiring 1204 are commonly connected to wiring 1307.

As the pull-up resistor 1306 is weaker in resistance than the pull-down resistor 1305, the potential of the wiring 1307 is in the vicinity of the power source voltage VDD. When any of the photo-detecting circuits 1301 detects the incidence of light, the wired OR element 1302 is turned on; when the voltage detecting circuit 1201 detects any abnormality of internal voltage, the wired OR element 1308 is turned on; and when the frequency detecting circuit 1202 detects any abnormality of frequency, the wired OR element 1309 is turned on. When any of the wired OR elements is turned on, the potential of the wiring 1307 falls to the vicinity of the ground VSS. This is detected by the reset circuit 1303; the reset signal 1304 is asserted; and the IC card microcomputer is initialized. Even if the wiring 1307 or the active shield wiring 1204 is cut off, the effect of the pull-down resistance 1305 serves to cause the potential of the wiring 1307 to the vicinity of the ground VSS, and similarly the IC card microcomputer is initialized. The reset instruction is not cancelled, and the operation of the IC card is stopped.

Further, where a metal foil for shading is to be formed over the top layer of the MOS constituting the photodetector element shown in FIG. 2, it may be accomplished by using active shield wiring or some other way of wiring. In such a case, as the wiring width would be usually narrow relative to the size of the MOS, the intensity of light can be differentiated by making dense the wiring over the MOS top layer to be shaded and making sparse the wiring over the MOS top layer not to be shaded.

Figure 19:
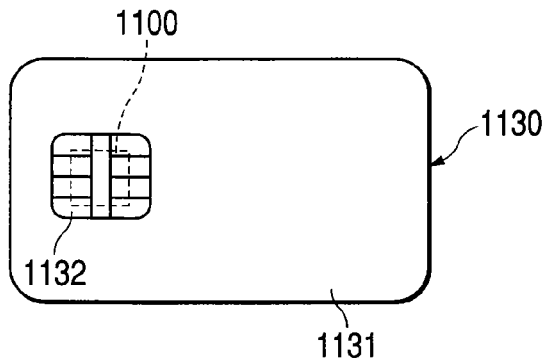
FIG. 19 is a plan of a typical appearance of an IC card of a contact interfacing type.

FIG. 19 is a plan of a typical appearance of an IC card 1130 of a contact interfacing type. On the surface of a card substrate 1131 consisting of synthetic resin, an external terminal 1132 formed of an electrode pattern as an external interfacing section is exposed, though this is not an absolute requirement, and the IC card microcomputer 1100, examples of which were shown in FIG. 12 and FIG. 16 referred to above, is embedded therein. To the electrode pattern is coupled the corresponding external terminal of the IC card microcomputer 1100.

Figure 20:
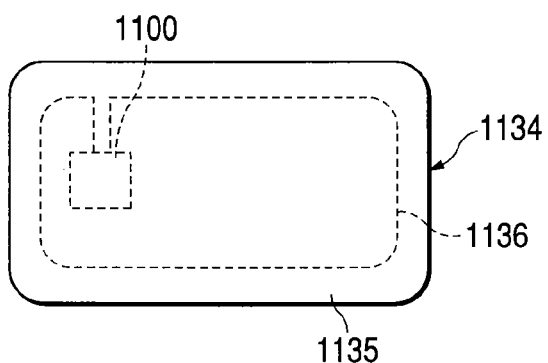
FIG. 20 is a plan of a typical appearance of an IC card of a non-contact interfacing type.

FIG. 20 is a plan of a typical appearance of an IC card 1134 of a non-contact interfacing type. In a card substrate 1135 consisting of synthetic resin, an antenna 1136 as an external interfacing section is embedded, though this is not an absolute requirement, and the IC card microcomputer 1100, examples of which were shown in FIG. 12 and FIG. 16 referred to above, is embedded therein. In this example, the IC card microcomputer 1100 has a high frequency section in the interface block 1114, and the antenna 1136 is coupled to this high frequency section.

Where the IC card 1130 or 1134 is to be used in an electronic money system, for instance a cryptographic key, monetary sum information and so forth are stored into the EEPROM 1117 in an encrypted form; when electronic money is to be used, the cryptographic key and monetary sum information are decrypted; the legitimacy of the intended use is judged according to the decrypted information and, if it is found legitimate, the required sum is remitted to the bank or is transferred to another IC card.

Where the IC card 1130 or 1134 is mounted on a mobile telephone for use, the user's telephone number, ID number, fee charge information and the like are stored in the EEPROM 1117 in an encrypted form; when the telephone is to be used, those items of information are decrypted; the legitimacy of the intended use is judged according to the decrypted information; if it is found legitimate, the fee charge information is updated according to the number of calls made, and the information is encrypted again.

The IC cards 1130 and 1134 described above can provide protection from hacking of data such as a cryptographic key by enforced resetting by the IC card microcomputer 1100 triggered by photo-detection, and thereby prevent damage to the user.

Figure 21:
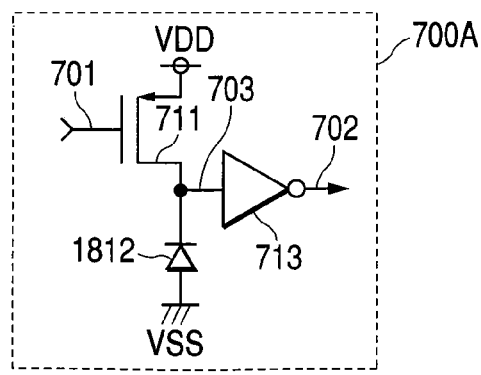
FIG. 21 is a circuit diagram showing a photodetector, which is a modified version of the inverter type photodetector shown in FIG. 7.

FIG. 21 shows a photodetector 700A, which is a modified version of the inverter type photodetector 700 shown in FIG. 7. In the circuit of FIG. 7, the pn junction of the drain in the photo-detecting MOS transistor 712 is used as the light receiving element, which is replaced by the pn junction of a diode 1812 in the photodetector 700A. When the reversely biased diode 1812 is irradiated with light, as in the case where the drain is used, a leak current generates.

When the negative logic enable signal rises to Hi, the potential 703 of the output rises to the power source potential VDD. The potential of the detector output signal 702 then is the ground potential VSS. When the diode 1812 is irradiated with light, a leak current generates and, if the intensity of the light is sufficiently great and the amperage of the leak current surpasses the current driving force of the sensitivity adjusting MOS transistor 711, the sensor output signal 703 will fall below the logical threshold of the output inverter 713, with the detector output 702 rising to Hi.

Figure 22:
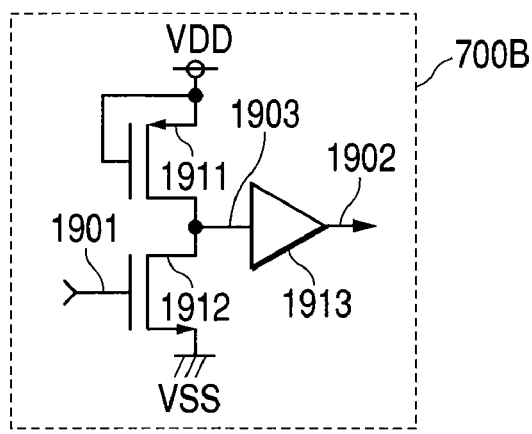
FIG. 22 is a circuit diagram showing a photodetector, which is another modified version of the inverter type photodetector shown in FIG. 7.

FIG. 22 shows a photodetector 700B, which is another modified version of the inverter type photodetector 700 shown in FIG. 7. The differences are that a MOS transistor 1911 for sensitivity adjustment is configured in a p-channel type and that the photo-detecting MOS transistor is configured in an n-channel type.

When a positive logic enable signal 1901 rises to Hi, a potential 1903 falls to the ground potential VSS. The potential of a detector output signal 1902 then is the ground potential VSS. When the drain of the MOS transistor 1911 in an off state is irradiated with light, a leak current generates and, if the intensity of the light is sufficiently great and the amperage of the leak current surpasses the current driving force of a MOS transistor 1912, the potential 1903 will rise above the logical threshold of a buffer 1913, with the detector output 1902 rising to Hi.

Figure 23:
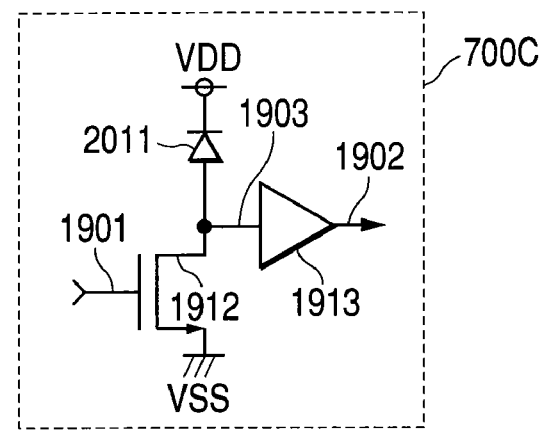
FIG. 23 is a circuit diagram showing a photodetector, which is a modified version of the example shown in FIG. 22.

FIG. 23 shows a photodetector 700C, which is a modified version of the example shown in FIG. 22. The MOS transistor 1911 used as the light receiving element in the example of FIG. 22 is replaced with a diode 2011. As the mode of basic operation of the diode 2011 is the same as what was described with reference to FIG. 21, its detailed description is dispensed with here.

Figure 24:
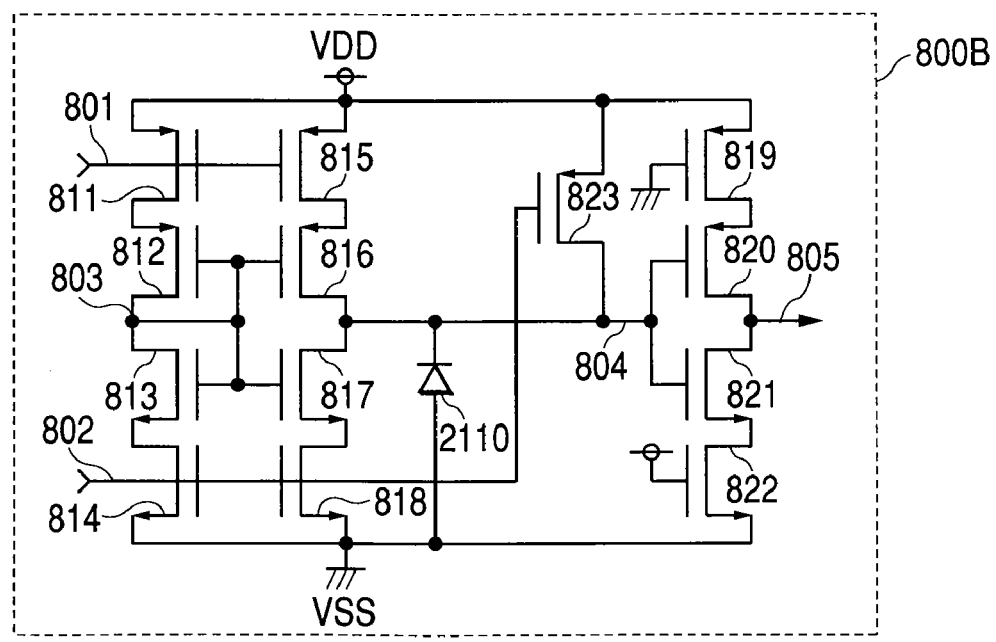
FIG. 24 is a circuit diagram showing a biased inverter type photodetector, which is a modified version of the example shown in FIG. 8.

FIG. 24 shows a biased inverter type photodetector 800B, which is a modified version of the biased inverter type photodetector 800 shown in FIG. 8. In the circuit shown in FIG. 8, the pn junction of the drain in the photo-detecting MOS transistor 817 is used as the light receiving element, which is replaced by the pn junction of a diode 2110 in FIG. 24. The diode 2110 is connected in a reversely biased state between the output 804 and the ground potential VSS of the circuit.

As the current driving forces of the MOS transistor 813 and the MOS transistor 817 are so set as the MOS transistor 813>the MOS transistor 817, the potential of the sensor signal 804 is higher than the logical threshold of the inverter configured of the MOS transistors 819 through 822. When the diode 2110 here is irradiated with light, a leak current generates and, if the intensity of the light is sufficiently great and the amperage of the leak current is sufficiently great, the potential of the sensor signal 804 will fall below the logical threshold of the inverter configured of the MOS transistors 819 through 822, with the detector output 805 rising from the vicinity of the ground potential to that of the power source potential VDD to make possible detection of the irradiation with light.

Figure 25:
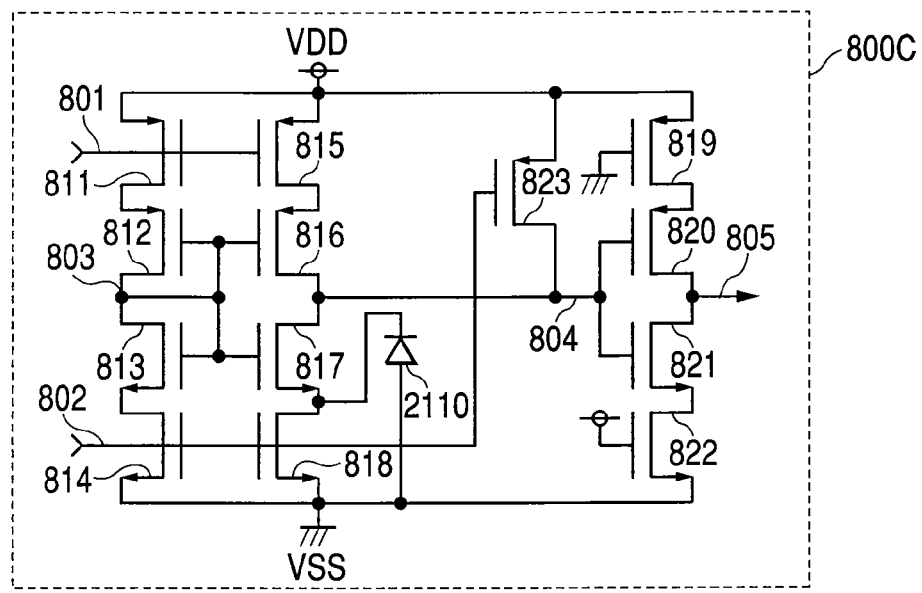
FIG. 25 is a circuit diagram showing a photodetector, which is a modified version of the example shown in FIG. 24.

FIG. 25 shows a photodetector 800C, which is a modified version of the example shown in FIG. 24. The difference consists in that the diode 2110 added in the configuration of FIG. 22 is arranged between the source of the MOS transistor 817 and the ground potential VSS of the circuit. As the mode of basic operation of the diode 2011 is the same as what was described with reference to FIG. 24, its detailed description is dispensed with here.

Figure 26:
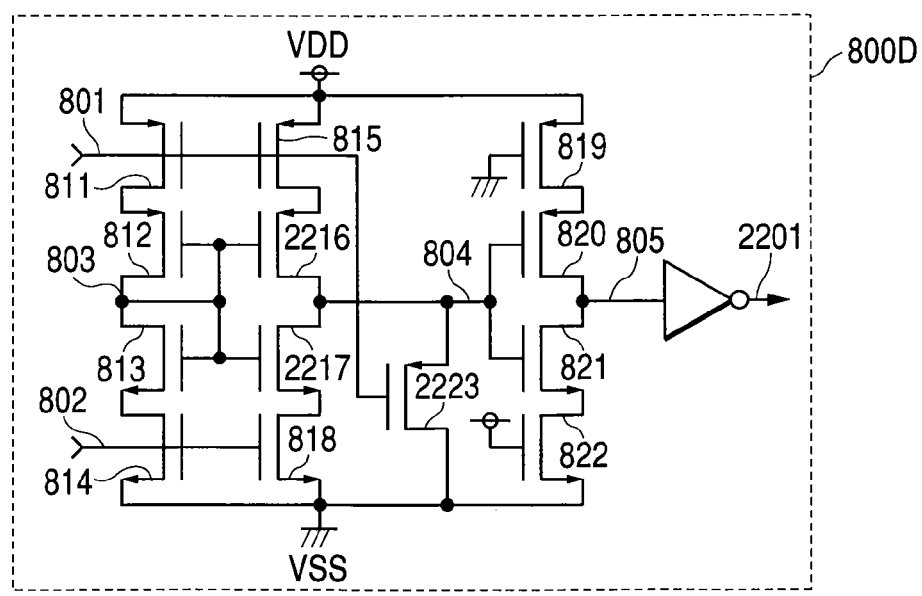
FIG. 26 is a circuit diagram showing a photodetector, which is a modified version of the biased inverter type photodetector shown in FIG. 8.

FIG. 26 shows a photodetector 800D, which is a modified version of the biased inverter type photodetector 800 shown in FIG. 8. Herein, out of an inverter configured of a p-channel type MOS transistor 2216 and an n-channel type MOS transistor 2217, the MOS transistor 2216 is used as the photo-detecting MOS transistor, and a MOS transistor 2223 for pulling down the sensor output is adopted in place of the pull-up MOS transistor 823.

While the current driving forces of the MOS transistors in FIG. 8 was such as the MOS transistor 812=the MOS transistor 816 and the MOS transistor 813>the MOS transistor 817, they are so set in the circuit of FIG. 26 as the MOS transistor 812>the MOS transistor 2216 and the MOS transistor 813=the MOS transistor 2217. Therefore, the potential of the sensor signal 804 is lower than the logical threshold of an inverter configured of the MOS transistors 819 through 822. When the MOS transistor 2216 used here as the light receiving element is irradiated with light, a leak current generates and, if the intensity of the light is sufficiently great and the amperage of the leak current is sufficiently high, the potential of the sensor signal 804 will rise above the logical threshold of an inverter configured of the MOS transistors 819 through 822, with the detector output signal 2201 rising from the vicinity of the ground potential VSS to that of the power source potential VDD, thereby enabling the irradiation with light to be detected.

Figure 27:
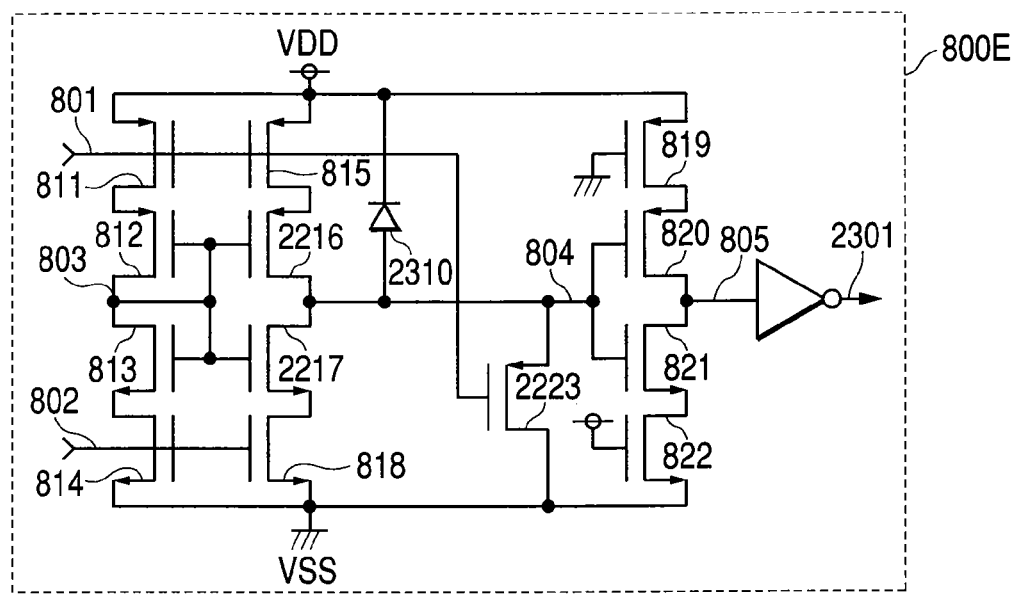
FIG. 27 is a circuit diagram showing a photodetector, which is a modified version of the example shown in FIG. 26.

FIG. 27 shows a photodetector 800E, which is a modified version of the example shown in FIG. 26. Herein, instead of the MOS transistor 2216 used as the light receiving element, a diode 2310 is added as the light receiving element. Description of the operation will be dispensed with. Though not shown, the connection of the diode 2310, as in FIG. 25, can be altered to a form in which it is connected in a reversely biased state between the source of the MOS transistor 2216 and the source voltage VDD.

Figure 28:
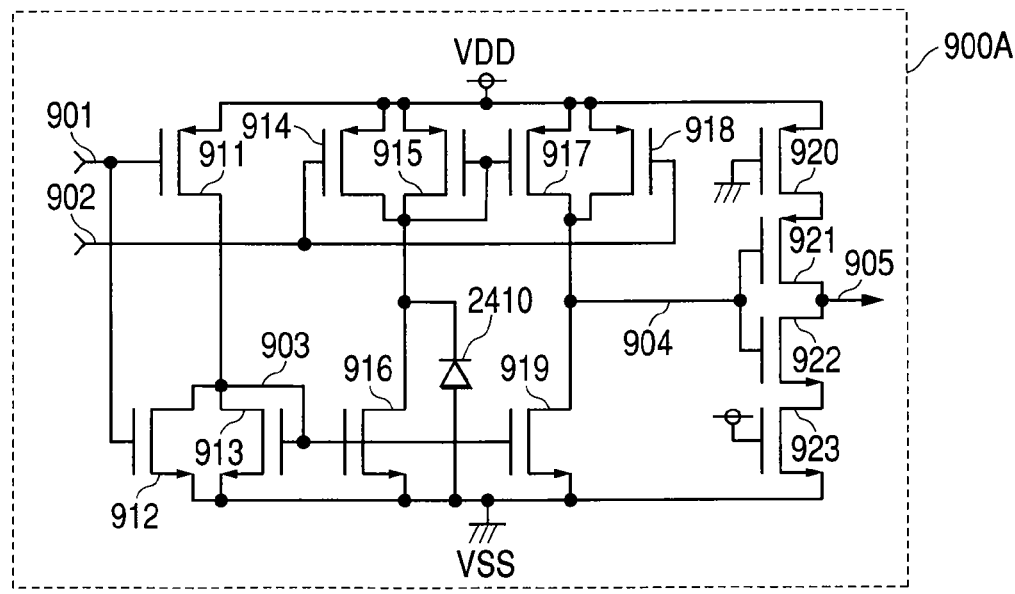
FIG. 28 is a circuit diagram showing a photodetector, which is a modified version of the current mirror type photodetector shown in FIG. 9.

FIG. 28 shows a photodetector 900A, which is a modified version of the current mirror type photodetector 900 shown in FIG. 9. A difference consists in that, instead of the MOS transistor 919 used as the light receiving element in the circuit shown in FIG. 9, a diode 2410 is added as the light receiving element. The diode 2410 is connected in a reversely biased state (reverse direction connection state) to the MOS transistor 916 in parallel.

As the current driving forces of the MOS transistor 916 and the MOS transistor 919 are set to be the MOS transistor 916>the MOS transistor 919, the potential of the sensor signal 904 is higher than the logical threshold of an inverter configured of the MOS transistors 920 through 923. When the diode 2410 is irradiated with light, a leak current generates and, if the intensity of the light is sufficiently great and the amperage of the leak current is sufficiently high, the potential of the sensor signal 904 will fall below the logical threshold of an inverter configured of the MOS transistors 920 through 923, with the detector output 905 rising from the vicinity of the ground potential VSS to that of the power source potential VDD, thereby enabling the irradiation with light to be detected.

Figure 29:
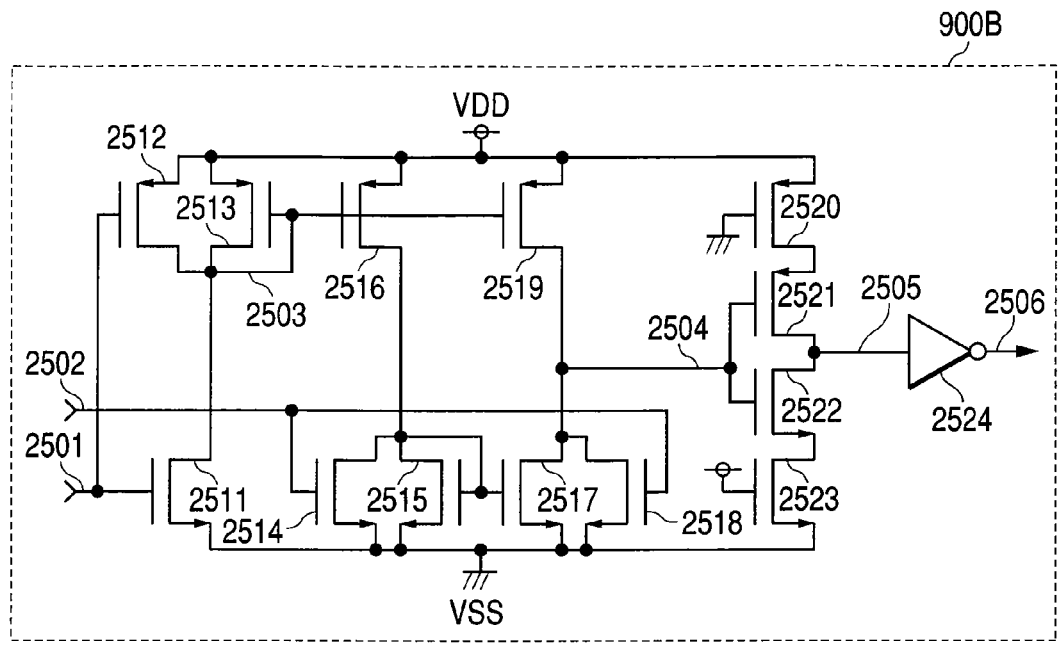
FIG. 29 is a circuit diagram showing a photodetector, which is another modified version of the current mirror type photodetector shown in FIG. 9.

FIG. 29 shows a photodetector 900B, which is another modified version of the current mirror type photodetector 900 shown in FIG. 9. The difference from the configuration shown in FIG. 9 is that the conductivity types (p-type and n-type) of the MOS transistors are interchanged. While a relationship of the MOS transistor 916>the MOS transistor 919 was set regarding the current driving forces of the MOS transistors 916 and 919 in the circuit of FIG. 9, a similar relationship of the MOS transistor 2516>the MOS transistor 2519 is also set in the circuit of FIG. 29. Therefore, the potential of a sensor signal 2504 is lower than the logical threshold of an inverter configured of MOS transistors 2520 through 2523. If here a MOS transistor 519 used as the light receiving element is irradiated with light, a leak current generates and, if the intensity of the light is sufficiently great and the amperage of the leak current is sufficiently high, the potential of the sensor signal 2504 will rise above the logical threshold of an inverter configured of the MOS transistors 2520 through 2523, with the detector output 2206 rising from the vicinity of the ground potential VSS to that of the power source potential VDD, thereby enabling the irradiation with light to be detected.

Figure 30:
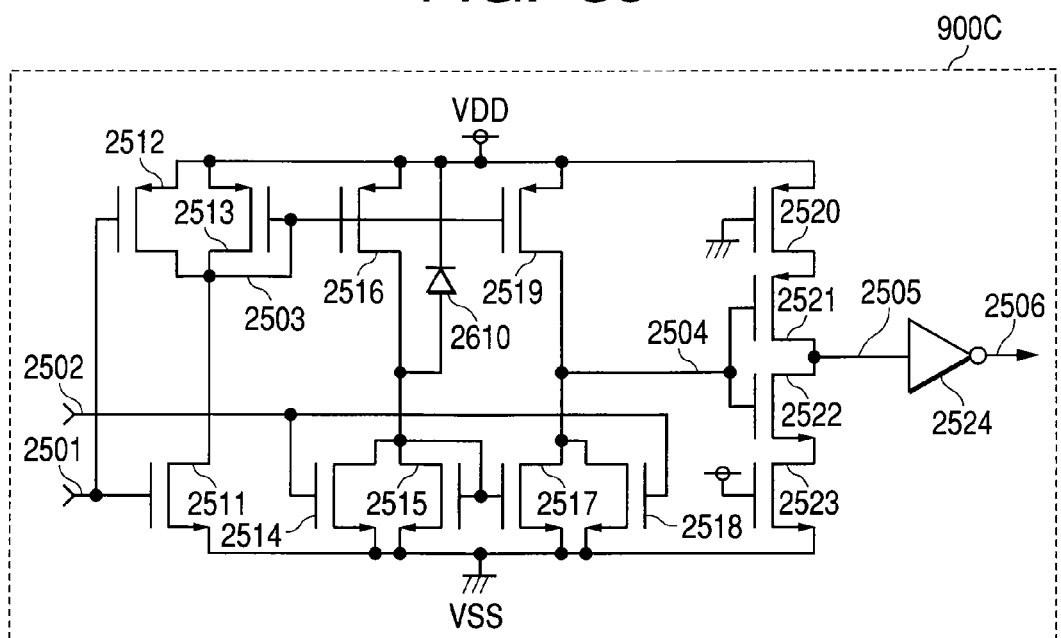
FIG. 30 is a circuit diagram showing a photodetector, which is a modified version of the current mirror type photodetector shown in FIG. 29.

FIG. 30 shows a photodetector 900C, which is a modified version of the current mirror type photodetector 900B shown in FIG. 29. The difference consists in that, instead of the MOS transistor 2519 used as the light receiving element in the circuit shown in FIG. 29, a diode 2610 is added as the light receiving element. The diode 2610 is connected in a reversely biased state (reverse direction connection state) to the MOS transistor 2516 in parallel. As the mode of basic operation the same as what was described with reference to FIG. 28, its detailed description is dispensed with here.

Figure 31:
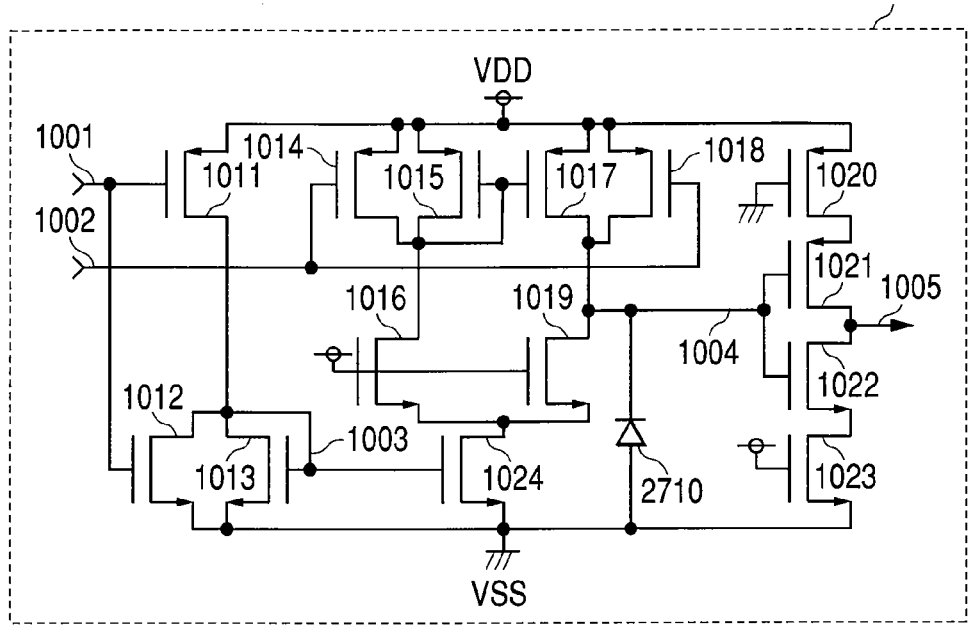
FIG. 31 is a circuit diagram showing a photodetector, which is a modified version of the differential AMP-type photodetector shown in FIG. 10.

FIG. 31 shows a photodetector 1000A, which is a modified version of the differential AMP-type photodetector 1000 shown in FIG. 10. In the photodetector 1000A shown in FIG. 31, instead of the MOS transistor 1019 used as the light receiving element in the configuration of FIG. 10, a diode 2710 is added as the light receiving element. As the current driving forces of the MOS transistor 1016 and the MOS transistor 1019 are set to be the MOS transistor 1016>the MOS transistor 1019, the potential of the sensor signal 1004 is higher than the logical threshold of an inverter configured of the MOS transistors 1020 through 1023. When the diode 2710 here is irradiated with light, a leak current generates and, if the intensity of the light is sufficiently great and the amperage of the leak current is sufficiently high, the potential of the sensor signal 1004 will fall below the logical threshold of an inverter configured of the MOS transistors 1020 through 1023, with the detector output 1005 rising from the vicinity of the ground potential VSS to that of the power source potential VDD, thereby enabling the irradiation with light to be detected.

Figure 32:
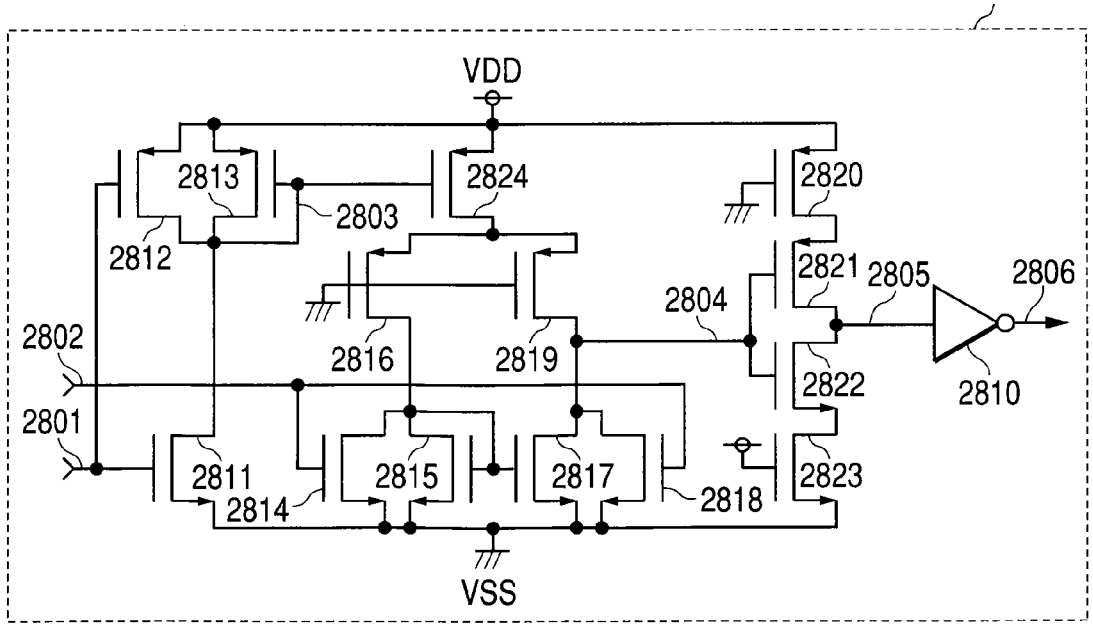
FIG. 32 is a circuit diagram showing a photodetector, which is another modified version of the differential AMP-type photodetector shown in FIG. 10.

FIG. 32 shows a photodetector 1000B, which is a modified version of the differential AMP-type photodetector 1000A shown in FIG. 10. A difference from the configuration shown in FIG. 31 is that the conductivity types (p-type and n-type) of the MOS transistors are interchanged. While the current supply capacities of the circuit of FIG. 10 was set to be the MOS transistor 1016>the MOS transistor 1019, the current drive capacities in the circuit of FIG. 32 are similarly set to be the MOS transistor 2816>the MOS transistor 2819. Therefore, the potential of a sensor signal 2804 is lower than the logical threshold of an inverter configured of MOS transistors 2820 through 2823. When the MOS transistor 2819 here used as the ht receiving element is irradiated with light, a leak current generates and, if the intensity of the light is sufficiently great and the amperage of the leak current is sufficiently high, the potential of the sensor signal 2804 will rise above the logical threshold of an inverter configured of the MOS transistors 2820 through 2823, with the detector output 2806 rising from the vicinity of the ground potential VSS to that of the power source potential VDD, thereby enabling the irradiation with light to be detected.

Figure 33:
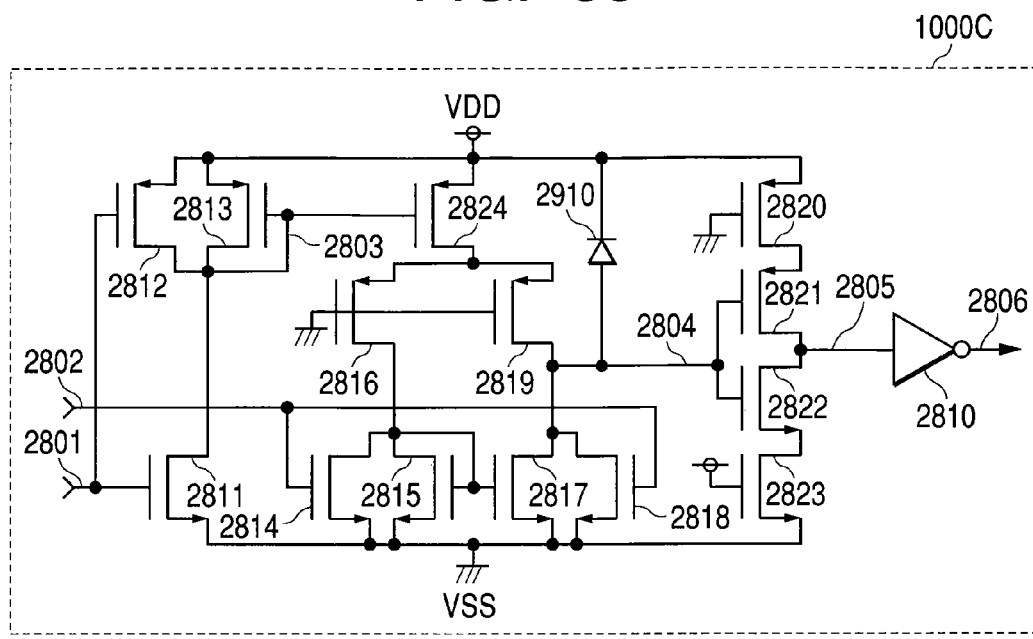
FIG. 33 is a circuit diagram showing a photodetector, which is a modified version of the detector shown in FIG. 32.

FIG. 33 shows a photodetector 1000C, which is a modified version of the circuit configuration shown in FIG. 29 is that, instead of the MOS transistor 2819 used as the light receiving element therein, a diode 2910 is added as the light receiving element. The diode 2910 is connected in a reversely biased state (reverse direction connection state) to the MOS transistor 2819 in parallel. As the mode of basic operation the same as what was described with reference to FIG. 29, its detailed description is dispensed with here.

Figure 34:
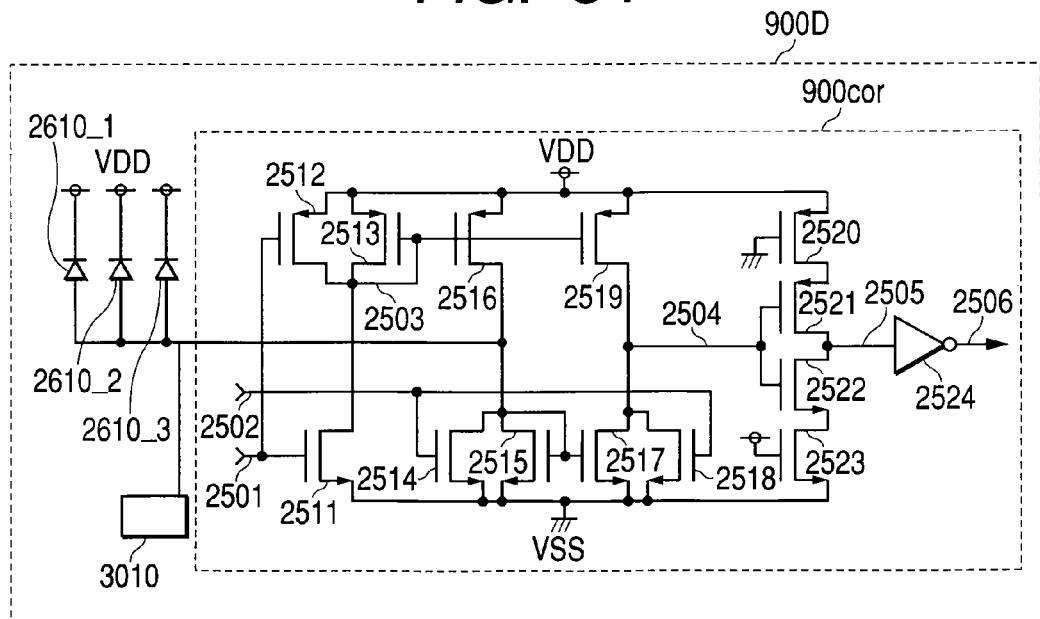
FIG. 34 is a circuit diagram showing a photodetector, which is a modified version of the photodetector shown in FIG. 29.

FIG. 34 showing a photodetector 900D, which is a modified version of the photodetector shown in FIG. 29. Where the light receiving element is independent as in FIG. 29, it is possible to arrange a diode away from other elements. In that case, as typically shown in FIG. 34, it is possible to have a plurality of diodes 2610_1 through 2610_3 as light receiving elements. As a single photodetector per se 900cor suffices even though there are a plurality of diode as light receiving elements, the circuit area can be kept small and power consumption can be saved. If at least one of the diodes 2610_1 through 2610_3 as the light receiving elements irradiated with light, it will react to the irradiation and detect the light.

Further in order to check whether of not the photodetector per se 900cor operates correctly, it is advisable to connected a testing circuit 3010 as illustrated. It is possible to simulate a state in which a sensor has reacted by having the testing circuit 3010 discharge a current, and thereby to check whether or not the photodetector per se operates correctly. To add, any of the circuits shown in FIG. 21, FIG. 23, FIG. 24, FIG. 27, FIG. 28, FIG. 31 and FIG. 33 can adopt in a similar configuration of a plurality of diodes and a single photodetector per se.

Figure 35:
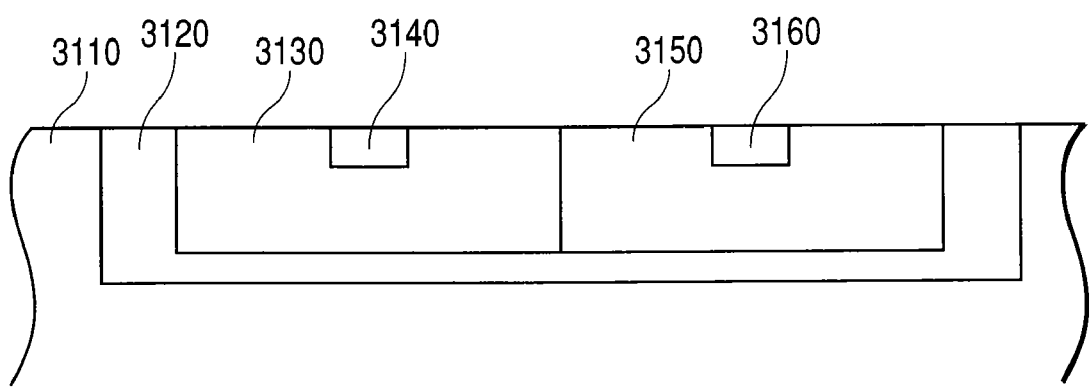
FIG. 35 shows a sectional view for describing the device structure of a diode to be used as the light receiving element.

FIG. 35 shows the configuration of a device section of a diode to be used as the light receiving element. The element known as a diode can be configured anywhere only if a p-type semiconductor and an n-type semiconductor are junctioned with each other. For instance, the pn junction of a p-type substrate 3110 and an n-type diffusion layer 3120 for power source separation can be used as a diode. Other combinations usable as diodes include (1) an n-type diffusion layer 3120 for power source separation and a p-type well region (P-WELL) 3130, (2) p-WELL 3130 and an $N^+$ diffusion layer 3140, and (3) n-WELL 3150 and a $P^+$ diffusion layer 3160. Thus a diode is nothing but a pn junction, and even if it is part of some other element, it can be covered by the concept of diode. Further by configuring a diode by utilizing a diffusion layer immediately below an element not formed over a silicon substrate, such as a capacitor or a resistor, an increase in square measure due to the addition of a diode or diodes can be restrained.

Although the invention made by the present inventor has been described in specific terms with reference to preferred embodiments thereof, obviously the invention is not confined to these embodiments, but can be varied in many different ways without deviating from its essentials.

For instance, photodetectors mainly consisting of static latches can as well be arranged in a non-SRAM memory array. The circuit module provided in the IC card microcomputer is not confined to what was described with reference to FIG. 12 and other drawings, but some other circuit module, such as a timer counter, can be mounted as well. The invention can be extensively applied to other semiconductor integrated circuits of a system-on-chip configuration then IC card microcomputers. To add, the technical means of shading with metal and increasing the drain area can also be applied to photodetectors for general photo-detecting purposes than the photodetectors according to the invention.

The invention claimed is:

1. A semiconductor integrated circuit comprising:
   a memory cell array; and
   a plurality of photo-detectors arranged in the memory cell array, each photo-detector including a photo-detecting semiconductor element constituting a static latch which holds a first state in its initial state, and which is changed into a second state from the first state when the photo-detecting semiconductor element is irradiated with light
   wherein photo-detection by said photodetectors is used for stopping internal actions, and
   wherein the memory cell array has an SRAM module in which static type memory cells are arranged in a matrix, and said photodetectors are arranged in the memory cell array of said SRAM module in place of some of the static type memory cells, the memory cell array having a redundant configuration which compensates for the static type memory cells replaced by photodetectors.

2. A semiconductor integrated circuit comprising:
   a memory cell array; and
   a plurality of photo-detectors arranged in the memory cell array, each photo-detector including a photo-detecting semiconductor element constituting a static latch which holds a first state in its initial state, and which is changed into a second state from the first state when the photo-detecting semiconductor element is irradiated with light,
   wherein photo-detection by said photodetectors is used for stopping internal actions,
   wherein the memory cell array has an SRAM module in which static type memory cells are arranged in a matrix, and said photodetectors are arranged in the memory cell array of said SRAM module in place of some of the static type memory cells replaced by the photodetectors, and
   wherein the semiconductor integrated circuit further comprises an FCC circuit that can detect and correct data errors resulting from the absence of said static type memory cells replaced by the photodetectors.

3. A semiconductor integrated circuit comprising:
   a memory cell array;
   a plurality of photo-detectors arranged in the memory cell array, each photo-detector including a photo-detecting semiconductor element constituting a static latch which holds a first state in its initial state, and which is changed into a second state from the first state when the photo-detecting semiconductor element is irradiated with light; and
   a metal film or a polysilicon film for shading upper layers of semiconductor elements other than the photo-detecting semiconductor elements of said photodetectors,
   wherein photo-detection by said photodetectors is used for stopping internal actions.

4. A semiconductor integrated circuit comprising:
   a memory cell array;
   a logic circuit module;
   a plurality of first photodetectors which is arranged in the memory cell array, the plurality of first photodetectors each including a photo-detecting semiconductor element constituting a static latch which holds a first state in its initial state, and are changed into a second state from the first state, when the photo-detecting semiconductor element is irradiated with light, wherein photo-detection signals provided by the first photodetectors are used for stopping internal actions of the logic circuit module; and
   a plurality of second photodetectors which is arranged in the logic circuit module, the plurality of second photodetectors each including a semiconductor element and a photo-detecting semiconductor element arranged in series on a current path and respectively placed in a state of conduction and in a state of non-conduction when they are operable, wherein a potential of a connection point between the semiconductor element in the state of conduction and the photo-detecting semiconductor element in the state of non-conduction varies according to the ratio between a current driving force varying when the photo-detecting semiconductor element in the state of non-conduction is irradiated with light and the current driving force of the semiconductor element in the state of conduction, and wherein photo-detection by said second photodetectors is used for stopping internal actions.

5. The semiconductor integrated circuit according to claim 4, comprising:
a first circuit having a semiconductor element for sensitivity adjustment on a current path;
a second circuit whose photo-detection sensitivity is adjusted by said first circuit and which has a photo-detecting semiconductor element on a current path; and
a third circuit for detecting the output node level of the second circuit,
said semiconductor integrated circuit further comprising in an analog circuit a plurality of third photodetectors for varying the output of said third circuit according to the output node level of said second circuit which is subject to current variations when said photo-detecting semiconductor element is irradiated with light,
wherein photo-detection by said third photodetectors is used for stopping internal actions.

6. A semiconductor integrated circuit comprising:
a memory cell array;
a plurality of photo-detectors arranged in the memory cell array, each photo-detector including a photo-detecting semiconductor element constituting a static latch which holds a first state in its initial state, and which is changed into a second state from the first state when the photo-detecting semiconductor element is irradiated with light;
wherein photo-detection by said photodetectors is used for stopping internal actions, and
wherein the semiconductor integrated circuit further comprises a reset circuit capable of making a reset signal based on a logical sum signal of photo-detection signals provided by individual photodetectors, the reset signal being used for initializing an interior and stopping an operation of the semiconductor integrated circuit.

7. An IC card on a card substrate, the IC card comprising:
an external interfacing section; and
a semiconductor integrated circuit connected to said external interfacing section,
the semiconductor integrated circuit including:
a memory cell array;
a logic circuit module;
a plurality of first photodetectors which is arranged in the memory cell array, the plurality of first photodetectors each including a photo-detecting semiconductor element constituting a static latch which holds a first state in its initial state, and are changed into a second state from the first state, when the photo-detecting semiconductor element is irradiated with light, wherein photo-detection signals provided by the first photodetectors are used for stopping internal actions of the logic circuit module; and
a plurality of second photodetectors which is arranged in the logic circuit module, the plurality of second photodetectors each including a semiconductor element and a photo-detecting semiconductor element arranged in series on a current path and respectively placed in a state of conduction and in a state of non-conduction when they are operable, wherein a potential of a connection point between the semiconductor element in the state of conduction and the photo-detecting semiconductor element in the state of non-conduction varies according to the ratio between a current driving force varying when the photo-detecting semiconductor element in the state of non-conduction is irradiated with light and the current driving force of the semiconductor element in the state of conduction, and wherein photo-detection by said second photodetectors is used for stopping internal actions.

8. The semiconductor integrated circuit according to claim 6, wherein active shield wiring is connected to a transmission path of the logical sum signal of said photo-detection signals.

9. A semiconductor integrated circuit comprising:
a memory cell array;
a plurality of photo-detectors arranged in the memory cell array, each photo-detector including a photo-detecting semiconductor element constituting a static latch which holds a first state in its initial state, and which is changed into a second state from the first state when the photo-detecting semiconductor element is irradiated with light;
a voltage detecting circuit for outputting a voltage detection signal which varies in response to an undesired fall of an operating voltage; and
a reset circuit capable of making a reset signal based on a logical sum signal of said voltage detection signal and photo-detection signals provided by individual photodetectors,
wherein photo-detection by said photodetectors is used for stopping internal actions.

10. A semiconductor integrated circuit comprising:
a memory cell array;
a plurality of photo-detectors arranged in the memory cell array, each photo-detector including a photo-detecting semiconductor element constituting a static latch which holds a first state in its initial state, and which is changed into a second state from the first state when the photo-detecting semiconductor element is irradiated with light;
a frequency detecting circuit for outputting a frequency detection signal which varies in response to an undesired variation of a clock signal frequency, and
a reset circuit capable of making a reset signal based on a logical sum signal of said frequency detection signal and photo-detection signals provided by individual photodetectors,
wherein photo-detection by said photodetectors is used for stopping internal actions.

11. A semiconductor integrated circuit comprising:
a memory cell array;
a plurality of photo-detectors arranged in the memory cell array, each photo-detector including a photo-detecting semiconductor element constituting a static latch which holds a first state in its initial state, and which is changed into a second state from the first state when the photo-detecting semiconductor element is irradiated with light;
a wiring cutoff detecting circuit for outputting a wiring cutoff detection signal which varies in response to any cutoff of prescribed internal wiring; and
a reset circuit capable of making a reset signal based on a logical sum signal of said wiring cutoff detection signal and photo-detection signals provided by individual photodetectors,
wherein photo-detection by said photodetectors is used for stopping internal actions.

* * * * *